(12) United States Patent
Kim et al.

(10) Patent No.: US 9,065,478 B1
(45) Date of Patent: Jun. 23, 2015

(54) DIGITAL TO-ANALOG CONVERSION APPARATUSES AND METHODS

(71) Applicant: Samsung Electronics Co., Ltd., Suwon-Si, Gyeonggi-Do (KR)

(72) Inventors: Je-kook Kim, Yongin-si (KR); Sang-yong Park, Suwon-si (KR); Chan-woo Park, Anyang-si (KR); Young hoon Lee, Seoul (KR); Byeong-ha Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/549,736

(22) Filed: Nov. 21, 2014

(30) Foreign Application Priority Data

Dec. 10, 2013 (KR) .................. 10-2013-0153309

(51) Int. Cl.
| | |
|---|---|
| *H03M 1/00* | (2006.01) |
| *H03M 1/66* | (2006.01) |
| *H03M 1/68* | (2006.01) |
| *H03M 1/06* | (2006.01) |

(52) U.S. Cl.
CPC .............. *H03M 1/661* (2013.01); *H03M 1/001* (2013.01); *H03M 1/68* (2013.01); *H03M 1/0624* (2013.01)

(58) Field of Classification Search
CPC ... H03M 1/661; H03M 1/001; H03M 1/0624; H03M 1/68
USPC .................. 341/110, 143, 144; 327/156–157
See application file for complete search history.

(56) References Cited

U.S. PATENT DOCUMENTS

| | | | |
|---|---|---|---|
| 5,262,779 A | 11/1993 | Sauer | |
| 5,604,465 A | 2/1997 | Farabaugh | |
| 6,160,449 A | 12/2000 | Klomsdorf et al. | |
| 6,275,685 B1 | 8/2001 | Wessel et al. | |
| 6,329,850 B1 * | 12/2001 | Mair et al. .................. | 327/107 |
| 6,874,097 B1 | 3/2005 | Aliahmad et al. | |
| 7,034,599 B1 | 4/2006 | Agrawal et al. | |
| 7,148,749 B2 | 12/2006 | Rahman et al. | |
| 7,443,326 B2 | 10/2008 | Raphaeli | |
| 7,706,160 B2 | 4/2010 | Fontana et al. | |
| 7,728,644 B2 | 6/2010 | Seo et al. | |
| 7,940,202 B1 | 5/2011 | Kutz et al. | |
| 8,134,486 B2 | 3/2012 | Lai et al. | |
| 8,248,282 B2 | 8/2012 | Payne et al. | |
| 8,472,556 B2 | 6/2013 | Shi et al. | |
| 8,564,342 B2 * | 10/2013 | Yao .............................. | 327/156 |

(Continued)

FOREIGN PATENT DOCUMENTS

| | | |
|---|---|---|
| JP | 2011-066894 A | 3/2011 |
| KR | 10-2001-0095928 A | 11/2001 |
| KR | 10-2008-0067466 A | 7/2008 |
| KR | 10-0904425 B1 | 6/2009 |
| KR | 10-1298375 B1 | 8/2013 |

*Primary Examiner* — Khai M Nguyen
(74) *Attorney, Agent, or Firm* — Harness, Dickey & Pierce, P.L.C.

(57) ABSTRACT

A digital-to-analog conversion apparatus to convert a digital signal to an output analog voltage signal includes an analog-to-digital conversion processing circuit and an analog voltage signal output circuit. The analog-to-digital conversion processing circuit is configured to increase a resolution of the digital-to-analog conversion apparatus without increasing a frequency of an input clock signal. The analog voltage signal output circuit is configured to generate the output analog voltage signal based on the input clock signal at the increased resolution of the digital-to-analog conversion apparatus.

20 Claims, 16 Drawing Sheets

(56) References Cited

U.S. PATENT DOCUMENTS

| | | |
|---|---|---|
| 2002/0091496 A1 | 7/2002 | Cheng et al. |
| 2011/0090940 A1 | 4/2011 | Wadhwa et al. |
| 2012/0230158 A1 | 9/2012 | Chuang et al. |
| 2014/0354335 A1 * | 12/2014 | Syllaios et al. ............... 327/157 |

* cited by examiner

DIGITAL-TO-ANALOG CONVERSION APPARATUSES AND METHODS

CROSS-REFERENCE TO RELATED APPLICATIONS

This application claims priority under 35 U.S.C. §119 to Korean Patent Application No. 10-2013-0153309, filed on Dec. 10, 2013, in the Korean Intellectual Property Office, the disclosure of which is incorporated herein in its entirety by reference.

BACKGROUND

1. Field

Example embodiments of inventive concepts relate to digital-to-analog conversion apparatuses and/or methods, for example, to high resolution digital-to-analog conversion apparatuses and/or methods for digital-to-analog conversion.

2. Description of Conventional Art

A conventional digital-to-analog conversion apparatus converts a digital signal into an analog signal. Conventional digital-to-analog conversion apparatuses are utilized in various electronic devices. Performance of conventional digital-to-analog conversion apparatuses may be determined by a controllable resolution.

Conventionally, resolution may be enhanced by increasing a clock frequency that is used in the digital-to-analog conversion apparatus. However, such a method for increasing resolution may be limited in increasing the clock frequency, and/or may adversely affect performance of a system due to high frequency noise.

SUMMARY

Example embodiments of inventive concepts provide digital-to-analog conversion apparatuses that may enhance resolution without increasing clock frequency.

Example embodiments of inventive concepts also provide digital-to-analog conversion methods that enhance resolution without increasing clock frequency.

At least one example embodiment provides digital-to-analog conversion apparatus including: an analog-to-digital conversion processing circuit configured to convert an analog voltage signal from an output terminal into a first digital signal, and to generate a second digital signal corresponding to a difference between the first digital signal and a target digital signal; a phase synthesis circuit configured to synthesize phases of signals, which are generated according to a delay and a skew delay, to generate a first control signal having a pulse width corresponding to error information included in the second digital signal, the delay being performed in units of a clock cycle based on the second digital signal, and the skew delay being performed within the clock cycle; and a charge pump circuit configured to select one of a charge loop and a discharge loop based on polarity information included in the second digital signal, and to generate the analog voltage signal according to a current flowing in the selected loop during an interval corresponding to the pulse width of the first control signal.

The phase synthesis circuit may be further configured to control the pulse width of the first control signal according to clock skew control based on the error information included in the second digital signal.

The digital-to-analog conversion apparatus may further include an analog buffer circuit including a first input terminal to receive the analog voltage signal output from the charge pump circuit, and a second input terminal connected to the output terminal.

The analog-to-digital conversion processing circuit may include: an analog-to-digital converter configured to convert the analog voltage signal from the output terminal into the first digital signal, the first digital signal having N bits, where N is an integer greater than or equal to two; and a subtraction circuit configured to generate the second digital signal corresponding to the difference between the first digital signal and the target digital signal. The second digital signal and the target digital signal may have N bits.

The analog-to-digital conversion processing circuit may include: an analog-to-digital converter configured to convert the analog voltage signal from the output terminal into the first digital signal, the first digital signal having M bits, where M is an integer greater than or equal to two; and a digital filter configured to receive the first digital signal, and to output the second digital signal based on an average filtering operation and a subtraction operation of the first digital signal and the target digital signal, the second digital signal having N bits, where N is an integer greater than M.

The digital filter may include: a first multiplier configured to multiply the first digital signal by a first coefficient to generate a first arithmetic signal having N bits; an adder configured to add the first arithmetic signal and a third arithmetic signal to generate a second arithmetic signal having N bits; a delayer configured to delay the second arithmetic signal to generate a delayed second arithmetic signal; a second multiplier configured to multiply a second coefficient and the delayed second arithmetic signal to generate the third arithmetic signal having N bits; a subtractor configured to subtract the second arithmetic signal from the target digital signal to generate a fourth arithmetic signal having N bits; a third multiplier configured to multiply the fourth arithmetic signal by a third coefficient to generate a fifth arithmetic signal; and a barrel shifter configured to generate the second digital signal by shifting the fifth arithmetic signal by at least one bit. Each of the first to third coefficients may be between zero and one.

The digital-to-analog conversion apparatus may further include a post-processor configured to: invert a value of bits of the second digital signal, except a polarity bit, when the polarity bit of the second digital signal has a first logic value; and output a value of the bits of the second digital signal as-is when the polarity bit of the second digital signal has a second logic value.

The phase synthesis circuit may be further configured to generate a second control signal corresponding to polarity information included in the second digital signal, and the charge pump circuit may be configured to select the one of the charge loop and discharge loop based on the second control signal.

The phase synthesis circuit may include: a first frequency divider configured to generate a first clock signal of which a pulse is generated at every two or more integer-multiple cycles of a second clock signal; a first delay circuit configured to generate a 2And clock signal by delaying the first clock signal in units of one-cycle time of the second clock signal, based on a value of bits of a first part of the second digital signal; a second delay circuit configured to generate a 2Bnd clock signal which is obtained by delaying the 2And clock signal in units of a set resolution time according to clock skew control based on a value of bits of a second part of the second digital signal; and a logic circuit configured to generate the first control signal having the pulse width corresponding to a sum of delay values in the first and second delay circuits, based on the first clock signal and the 2Bnd clock signal.

The bits of the first part of the second digital signal may include a most significant bit (MSB) indicating polarity information and a number of upper bits indicating a delay value of the first delay circuit, and the bits of the second part of the second digital signal may include a number of lower bits indicating a delay value of the second delay circuit.

The second delay circuit may include: a delay chain including a plurality of delay cells connected in series and corresponding to a number of the bits of the second part of the second digital signal; and a decoder configured to control operations of the plurality of delay cells based on the value of the bits of the second part of the second digital signal. A delay time of each of the plurality of delay cells of the delay chain may be set to increase by two times when a bit moves to an upper bit by one bit, with respect to a delay time of a delay cell corresponding to a least significant bit (LSB).

The phase synthesis circuit may further include: a calibration information calculating circuit configured to calculate a skew calibration value corresponding to a value that is delayed during one cycle of the second clock signal in a circuit equivalent to the second delay circuit, and to multiply the bits of the second part of the second digital signal by the calculated skew calibration value to generate a normalized value of the bits of the second part of the second digital signal.

The calibration information calculating circuit may include: a second frequency divider configured to divide a frequency of the second clock signal by two; a delay chain including a plurality of delay cells connected in series and corresponding to a number of the bits of the second part of the second digital signal, the delay chain being configured to delay the two-frequency-divided second clock signal based on a decoding value; a decoder configured to generate the decoding value for controlling the plurality of delay cells of the delay chain; a RS flip-flop including a set terminal to receive the two-frequency-divided second clock signal, a reset terminal to receive a signal obtained through delay by the delay chain, and a Q terminal to output a signal generated based on the received signals; a decoder control circuit configured to increase or decrease the decoding value based on a logic value of the signal output from the Q terminal of the RS flip-flop, to generate the skew calibration value; and a multiplier configured to multiply the bits of the second part of the second digital signal by the skew calibration value to generate the normalized value of the bits of the second part of the second digital signal, and to supply the normalized value of the bits of the second part of the second digital signal to the second delay circuit.

At least one other example embodiment provides a digital-to-analog conversion method comprising: converting an analog voltage signal from an output terminal into a first digital signal; generating a second digital signal corresponding to a difference between the first digital signal and a target digital signal; synthesizing phases of signals generated according to delay control and skew delay to generate a charge pump control signal, the delay control being performed in units of a clock cycle and based on the second digital signal, and the skew delay being performed within the clock cycle; and controlling a charge or discharge time of a charge pump circuit according to the charge pump control signal to generate the analog voltage signal.

The synthesizing phases of signals may include: generating a control signal for selecting a charge loop or discharge loop of the charge pump circuit, based on polarity bit information included in the second digital signal; and synthesizing the phases of the signals to generate the charge pump control signal, the charge pump control signal having a pulse width corresponding to error information included in the second digital signal.

At least one other example embodiment provides a digital-to-analog conversion apparatus to convert a digital signal to an output analog voltage signal, the apparatus including: an analog-to-digital conversion processing circuit configured to increase a resolution of the digital-to-analog conversion apparatus without increasing a frequency of an input clock signal; and an analog voltage signal output circuit configured to generate the output analog voltage signal based on the input clock signal at the increased resolution of the digital-to-analog conversion apparatus.

The analog-to-digital conversion processing circuit may be further configured to convert the output analog voltage signal to a first digital signal, and to generate an error digital signal based on the first digital signal and a target digital signal; the error digital signal may correspond to a difference between the first digital signal and the target digital signal; and the analog voltage signal output circuit may be configured to generate the output analog voltage signal based on the input clock signal and the error digital signal.

The error digital signal may include a plurality of bits, a first bit among the plurality of bits being indicative of polarity information associated with the output analog voltage signal, and second bits among the plurality of bits being indicative of error information associated with the output analog voltage signal. The analog voltage signal output circuit may adjust the voltage of the output analog voltage signal based on the polarity information and the error information.

The analog voltage signal output circuit may include: a phase synthesis circuit configured to generate first and second control signals based on the error digital signal, the first control signal having a pulse width corresponding to the error information, and the second control signal being indicative of the polarity information; and a charge pump circuit configured to adjust a voltage level of the output analog voltage signal by selecting one of a charge loop and a discharge loop of the charge pump circuit based on the second control signal, and generating the output analog voltage signal according to a current that flows in the selected loop during a period corresponding to a pulse width of the first control signal.

The analog voltage signal output circuit may include: a phase synthesis circuit configured to generate a plurality of control signals based on the error digital signal; and a charge pump circuit configured to adjust the voltage level of the output analog voltage signal by selecting one of a charge loop and a discharge loop based on the plurality of control signals.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1A:
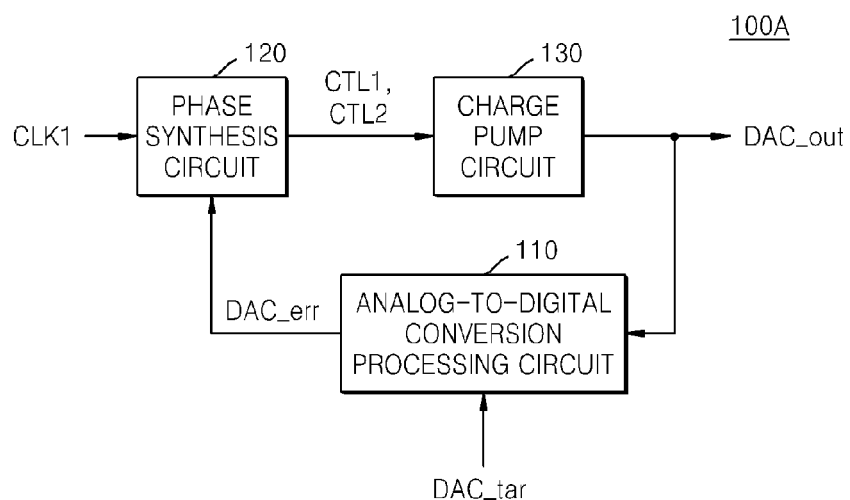
FIG. 1A is a block diagram illustrating a configuration of a digital-to-analog conversion apparatus according to an example embodiment of inventive concepts.

Expressions such as "at least one of," when preceding a list of elements, modify the entire list of elements and do not modify the individual elements of the list.

Hereinafter, example embodiments of inventive concepts will be described in detail with reference to the accompanying drawings. Example embodiments of inventive concepts are provided so that this disclosure will be thorough and complete, and will fully convey the concept of inventive concepts to one of ordinary skill in the art. Since inventive concepts may have diverse modified embodiments, example embodiments are illustrated in the drawings and are described in the detailed description of inventive concepts. However, this does not limit inventive concepts within specific embodiments and it should be understood that inventive concepts cover all the modifications, equivalents, and replacements within the idea and technical scope of inventive concepts. Like reference numerals refer to like elements throughout. In the drawings, the dimensions and size of each structure are exaggerated, reduced, or schematically illustrated for convenience in description and clarity.

The terms used in this application, only certain embodiments have been used to describe, is not intended to limit the present embodiments. In the following description, the technical terms are used only for explain a specific exemplary embodiment while not limiting the present embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As discussed herein, example embodiments of digital-to-analog conversion apparatuses and/or one or more components thereof may be hardware, firmware, hardware executing software or any combination thereof. When the digital-to-analog conversion apparatuses and/or one or more components thereof are hardware, such hardware may include one or more Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of the digital-to-analog conversion apparatuses and/or one or more components thereof. CPUs, SOCs, DSPs, ASICs and FPGAs may sometimes generally be referred to as processors and/or microprocessors.

As discussed herein, one or more example embodiments of digital to analog conversion apparatuses and/or one or more components thereof may be hardware, firmware, hardware executing software or any combination thereof. When the digital to analog conversion apparatuses and/or one or more components thereof are hardware, such hardware may include one or more Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of the digital to analog conversion apparatuses and/or one or more components thereof. CPUs, SOCs, DSPs, ASICs and FPGAs may sometimes generally be referred to as processors and/or microprocessors.

A digital-to-analog conversion apparatus according to an example embodiment of inventive concepts converts a digital signal into an analog signal by charging or discharging an internal capacitor using a constant current source of a charge pump circuit based on an analog-to-digital converted digital signal.

In more detail, a voltage "V" of an internal capacitor is expressed as shown below in Equation (1):

$$dV/dt = i/C \qquad (1)$$

In Equation (1), i denotes a current flowing in the internal capacitor, t denotes a time, and C denotes a capacitance of the internal capacitor.

Referring to Equation (1), a voltage may vary with time "t" when the capacitance "C" and the current "i" are fixed. For example, when a frequency of a system clock signal applied to a system is about 2 MHz, 32 GHz-unit time control may be performed for expressing the time "t" as 16 bits. Theoretically, when a clock signal of about 32 GHz is newly generated and used, the time "t" may be expressed as 16 bits. However, since a relatively large amount of noise occurs in a clock signal having a relatively high frequency of about 32 GHz, the noise may adversely affect the system and it may be relatively difficult to precisely generate the clock signal.

At least one example embodiment provides a method that increases resolution of the digital-to-analog conversion system by using an analog-to-digital converter without increasing a frequency of a clock signal in a digital-to-analog conversion system. In more detail, at least one example embodiment provides a method that increases a resolution of a digital-to-analog conversion apparatus by using phase synthesis technology based on clock skew control.

Moreover, at least one example embodiment provides a method that is not affected by process characteristics and/or voltage variation by applying phase skew control normalized by calibration to compensate for process characteristic changes in a phase skew chain path.

FIG. 1A is a block diagram illustrating a configuration of a digital-to-analog conversion apparatus 100A according to an example embodiment of inventive concepts.

As illustrated in FIG. 1A, the digital-to-analog conversion apparatus 100A includes: an analog-to-digital conversion processing circuit 110; a phase synthesis circuit 120; and a charge pump circuit 130.

An analog voltage signal DAC_out, which is output through an output terminal of the digital-to-analog conversion apparatus 100A, is input to the analog-to-digital conversion processing circuit 110. The analog-to-digital conversion processing circuit 110 converts the input analog voltage signal DAC_out into a first digital signal, and generates a second digital signal DAC_err corresponding to a difference between the first digital signal and a target digital signal DAC_tar.

For example, the second digital signal DAC_err may be composed of a bit, indicating polarity information, and bits indicating error information. In detail, a most significant bit (MSB) of the second digital signal DAC_err may indicate the polarity information, and bits other than the MSB may indicate the error information.

The phase synthesis circuit 120 generates a second control signal CTL2 having a logic level corresponding to the polarity information included in the second digital signal DAC_err, and generates a first control signal CTL1 having a pulse width corresponding to the error information included in the second digital signal DAC_err. For example, a most significant bit (MSB) output indicating the polarity information of the second digital signal DAC_err may be the second control signal CTL2.

For example, the phase synthesis circuit 120 may synthesize phases of signals that are generated according to delay control (performed in units of a clock cycle) and skew control (performed within the clock cycle) that are performed based on the error information included in the second digital signal DAC_err, thereby generating the first control signal CTL1 having a pulse width corresponding to the error information.

The charge pump circuit 130 selectively forms a charge loop or a discharge loop that charges or discharges an internal capacitor on the basis of a logic level of the second control signal CTL2, and allows a current to flow in a selected loop during an interval (e.g., section or time period) corresponding to a pulse width of the first control signal CTL1. Through such an operation, the charge pump circuit 130 outputs an analog voltage signal DAC_out of which a voltage level has been adjusted based on the second digital signal DAC_err.

Figure 1B:
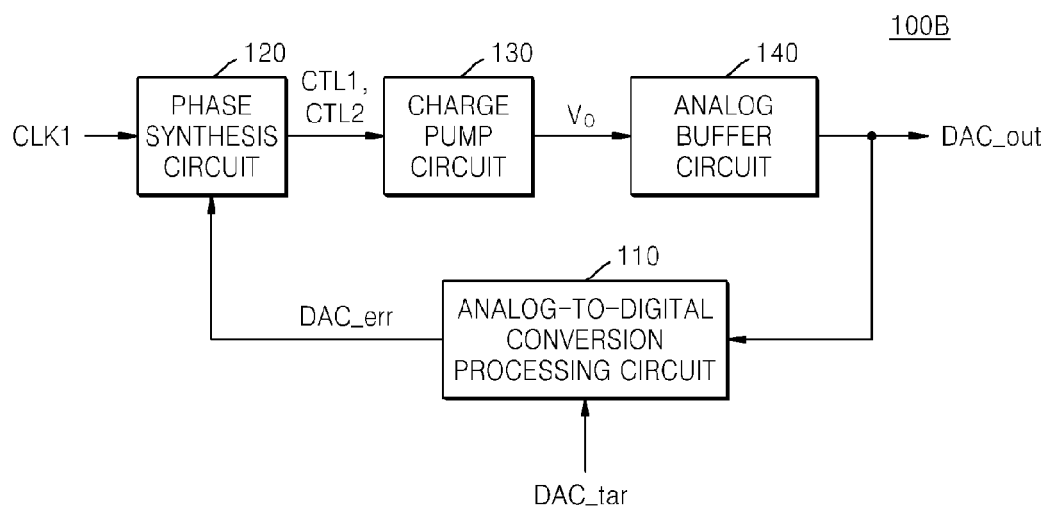
FIG. 1B is a block diagram illustrating a configuration of a digital-to-analog conversion apparatus according to another example embodiment of inventive concepts.

FIG. 1B is a block diagram illustrating a configuration of a digital-to-analog conversion apparatus 100B according to another example embodiment of inventive concepts.

As illustrated in FIG. 1B, the digital-to-analog conversion apparatus 100B includes: an analog-to-digital conversion processing circuit 110; a phase synthesis circuit 120; a charge pump circuit 130; and an analog buffer circuit 140.

The digital-to-analog conversion apparatus 100B of FIG. 1B is similar to the digital-to-analog conversion apparatus 100A of FIG. 1A, but further includes the analog buffer circuit 140. The analog-to-digital conversion processing circuit 110, the phase synthesis circuit 120, and the charge pump circuit 130 may be configured in the same or substantially the same manner as the digital-to-analog conversion apparatus 100A of FIG. 1A. The charge pump circuit 130 of FIG. 1B outputs an analog voltage Vo of which a voltage level has been adjusted based on the second digital signal DAC_err.

Since the analog-to-digital conversion processing circuit 110, the phase synthesis circuit 120, and the charge pump circuit 130 have been described above with reference to FIG. 1A, repetitive descriptions are not provided here.

The analog buffer circuit 140 receives the analog voltage Vo output from the charge pump circuit 130, and outputs an output voltage DAC_out following the input voltage Vo. The analog buffer circuit 140 suppresses and/or prevents the output voltage DAC_out from being varied due to a variation of an output current. For example, as illustrated in FIG. 15, the analog buffer circuit 140 may be implemented as a voltage follower circuit of which a gain is 1.

Figure 15:
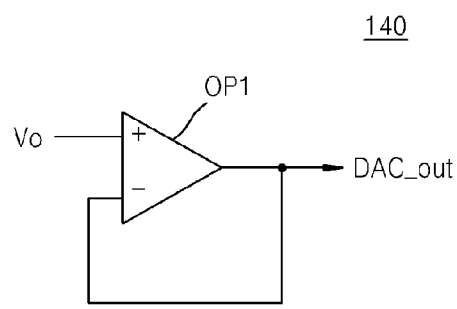
FIG. 15 is a diagram illustrating an example detailed configuration of an analog buffer circuit of FIG. 1B.

Referring to FIG. 15, an analog voltage signal output from the charge pump circuit 130 may be applied to a positive input terminal (+) of an operational amplifier OP1, and an output terminal of the operation amplifier OP1 may be connected to a negative input terminal (−) of the operational amplifier OP1, thereby implementing a voltage follower circuit of which a gain is 1.

In the example embodiments shown in FIGS. 1A and 1B, the phase synthesis circuit 120 and the charge pump circuit 130 may be referred to as an analog voltage signal output circuit. The analog-to-digital conversion processing circuit 110 may be characterized as configured to increase a resolution of the digital-to-analog conversion apparatus without increasing a frequency of an input clock signal.

Figure 2:
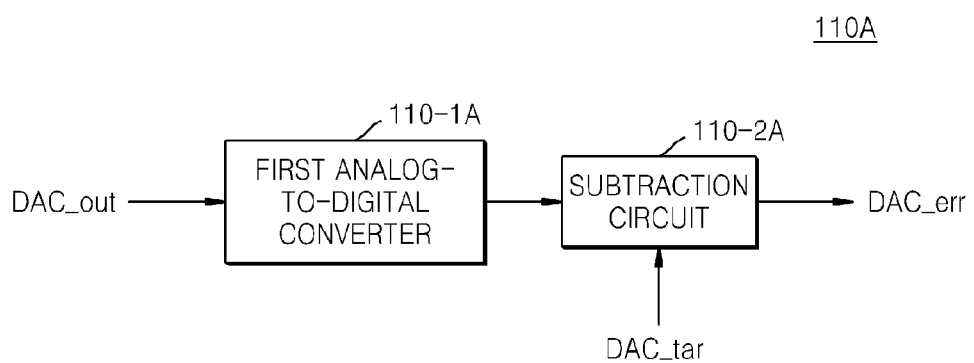
FIG. 2 is a diagram illustrating an example of a detailed configuration of the analog-to-digital conversion processing circuit of FIG. 1A or 1B.

FIG. 2 is a diagram illustrating an example of a detailed configuration of the analog-to-digital conversion processing circuit 110 of FIG. 1A or 1B.

As illustrated in FIG. 2, the analog-to-digital conversion processing circuit 110A includes a first analog-to-digital converter 110-1A and a subtraction circuit 110-2A.

The first analog-to-digital converter 110-1A converts the analog voltage signal DAC_out of an output terminal into a 1And digital signal of N (where N is an integer greater than or equal to two) bits. Here, a resolution level of the digital-to-analog conversion apparatus 100A or 100B is determined based on the number of bits of the 1And digital signal.

The subtraction circuit 110-2A receives the 1And digital signal of N bits output from the first analog-to-digital converter 110-1A. The subtraction circuit 110-2A generates a second digital signal DAC_err of N bits corresponding to a difference between the 1And digital signal of N bits and a target digital signal DAC_tar of N bits. For example, the subtraction circuit 110-2A may generate a second digital signal DAC_err by subtracting the 1And digital signal from the target digital signal DAC_tar. As another example, the subtraction circuit 110-2A may generate the second digital signal DAC_err by subtracting the target digital signal DAC_tar from the 1And digital signal. In at least one example embodiment of inventive concepts, an example in which the second digital signal DAC_err is generated by subtracting the 1And digital signal from the target digital signal DAC_tar will be described. The MSB of the second digital signal DAC_err may indicate a polarity.

Here, the second digital signal DAC_err denotes a digital error signal of the digital-to-analog conversion apparatus 100A or 100B.

For example, the subtraction circuit 110-2A may perform a post-processing operation that, when the MSB indicating polarity information of the second digital signal DAC_err has a first logic value, inverts a value of bits composing the second digital signal DAC_err, except a polarity bit, but when the MSB of the second digital signal DAC_err has a second logic value, outputs a value of bits composing the second digital signal DAC_err as-is.

Figure 3:
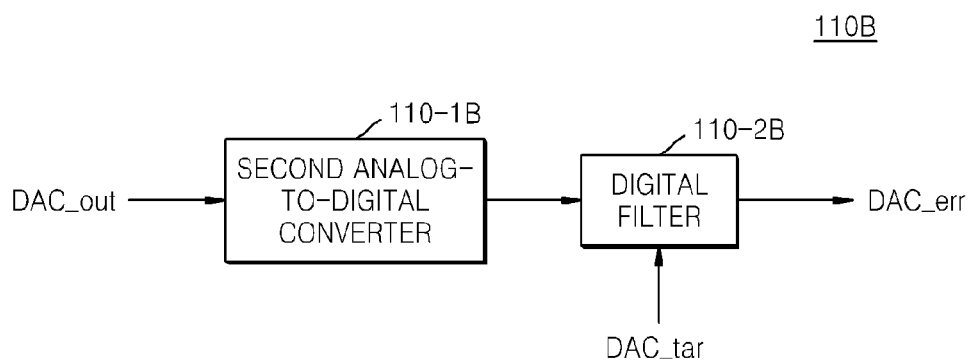
FIG. 3 is a diagram illustrating another example of a detailed configuration of the analog-to-digital conversion processing circuit of FIG. 1A or 1B.

FIG. 3 is a diagram illustrating another example of a detailed configuration of the analog-to-digital conversion processing circuit 110 of FIG. 1A or 1B.

As illustrated in FIG. 3, an analog-to-digital conversion processing circuit 110B includes a second analog-to-digital converter 110-1B and a digital filter 110-2B.

The second analog-to-digital converter 110-1B converts the analog voltage signal DAC_out of an output terminal into a 1Bnd digital signal of M (where M is an integer greater than or equal to two) bits. Here, the number "M" of bits of the 1Bnd digital signal is determined less than N that is used to determine a resolution level of the digital-to-analog conversion apparatus 100A or 100B. For example, when N is set 16, M may be 10. M and N may be variously determined in consideration of performance of a system to which the digital-to-analog conversion apparatus 110A or 110B is applied.

The digital filter 110-2B receives the 1Bnd digital signal output from the second analog-to-digital converter 110-1B, and outputs a second digital signal DAC_err of N (where N is an integer greater than M) bits based on an average filtering operation and a subtraction operation of the 1Bnd digital signal and a target digital signal DAC_tar. The MSB of the second digital signal DAC_err may indicate a polarity.

The digital filter 110-2B performs the average filtering operation at each sampling time for the 1Bnd digital signal of M bits to generate a first C digital signal of N bits, and generates the second digital signal DAC_err of N bits corresponding to a difference between the first C digital signal of N bits and the target digital signal DAC_tar. For example, the digital filter 110-2B may generate the second digital signal DAC_err by subtracting the first C digital signal from the target digital signal DAC_tar. As another example, the digital filter 110-2B may generate the second digital signal DAC_err by subtracting the target digital signal DAC_tar from the first C digital signal. In at least one example embodiment of inventive concepts, an example in which the second digital signal DAC_err is generated by subtracting the first C digital signal from the target digital signal DAC_tar will be described.

Figure 4:
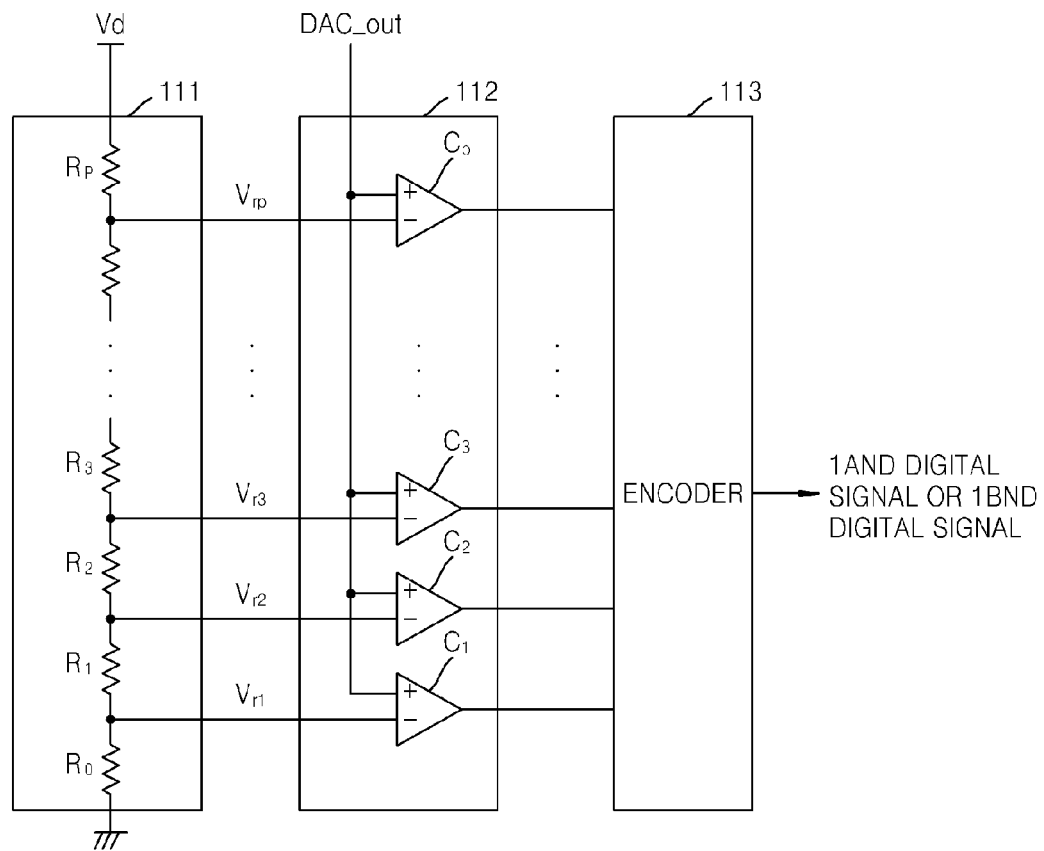
FIG. 4 is a diagram illustrating an example detailed configuration of an analog-to-digital converter of FIG. 2 or 3.

FIG. 4 is a diagram illustrating an example detailed configuration of the first analog-to-digital converter 110-1A of FIG. 2 or the second analog-to-digital converter 110-1B of FIG. 3.

The first analog-to-digital converter 110-1A or the second analog-to-digital converter 110-1B includes: a reference voltage generating circuit 111; a comparison circuit 112; and an encoder (or encoder circuit) 113.

The reference voltage generating circuit 111 includes a plurality of resistors R0 to Rp that are serially connected between a source voltage Vd terminal and ground, and generates a plurality of reference voltages Vr1 to Vrp through a plurality of nodes that are respectively disposed between the serially connected plurality of resistors R0 to Rp. For example, the plurality of resistors R0 to Rp may be set to have the same or substantially the same resistance value. For example, a value of p may be determined as $2^M-1$ for implementing the analog-to-digital converter 110-1B of M bits. That is, $2^{10}$ resistors may be serially connected between the source voltage Vd terminal and ground for implementing the analog-to-digital converter 110-1B of 10 bits.

The comparison circuit 112 includes p number of comparators C1 to Cp. A reference voltage, which matches a corresponding comparator, is applied to a first input terminal of each of the comparators C1 to Cp, and an analog voltage signal DAC_out is applied to a second input terminal of each of the comparators C1 to Cp. In one example, $2^M-1$ comparators may be used for implementing the analog-to-digital converter 110-1B of M bits. That is, $2^{10}-1$ comparators may be used for implementing the analog-to-digital converter 110-1B of 10 bits.

For example, the first input terminal of each of the comparators C1 to Cp may be set to a negative (–) input terminal, and the second input terminal may be set to a positive (+) input terminal. As another example, the first input terminal of each of the comparators C1 to Cp may be set to the positive (+) input terminal, and the second input terminal may be set to the negative (–) input terminal.

A reference voltage Vr1 is applied to the first input terminal of the comparator C1, a reference voltage Vr2 is applied to the first input terminal of the comparator C2, and a reference voltage Vrp is applied to the first input terminal of the comparator Cp. In this way, a reference voltage matching a corresponding comparator is also applied to the first input terminal of each of the other comparators.

Each of the comparators C1 to Cp compares a voltage of the first input terminal and a voltage of the second input terminal to output a signal having a logic value corresponding to the comparison result. For example, in a case where the first input terminal is set to the negative (–) input terminal and the second input terminal is set to the positive (+) input terminal, each of the comparators C1 to Cp generates an output having a high level "High" when a voltage of the analog voltage signal DAC_out is greater than or equal to the reference voltage, and when the voltage of the analog voltage signal DAC_out is less than the reference voltage, each of the comparators C1 to Cp generates an output having a low level "Low".

The encoder 113 encodes output signals of the comparators C1 to Cp of the comparison circuit 112 to generate a digital signal. For example, when the value of p is $2^M-1$, the encoder 113 generates the 1Bnd digital signal of M bits. As another example, when the value of p is $2^N-1$, the encoder 113 generates the 1And digital signal of N bits.

Figure 5:
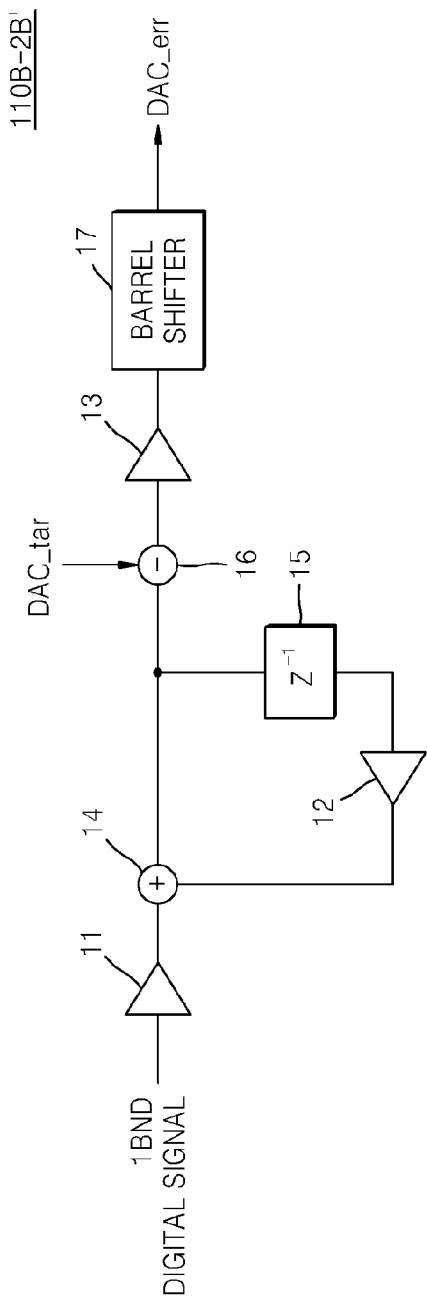
FIG. 5 is a diagram illustrating an example detailed configuration of a digital filter of FIG. 3.

FIG. 5 is a diagram illustrating an example detailed configuration of a digital filter 110-2B' of FIG. 3.

As illustrated in FIG. 5, the digital filter 110-2B' includes: first to third multipliers 11 to 13; an adder 14; a delayer 15; a subtractor 16; and a barrel shifter 17.

The first multiplier 11 receives the 1Bnd digital signal of M bits output from the analog-to-digital converter 110-1B, and outputs a first arithmetic signal of N bits, which is obtained by multiplying the 1Bnd digital signal by a first coefficient, to the adder 14.

The adder 14 outputs a second arithmetic signal of N bits, which is obtained by adding the first arithmetic signal and a third arithmetic signal, which is output from the second multiplier 12, to the delayer 15 and the subtractor 16. The second arithmetic signal, which is output from the adder 14, corresponds to a signal obtained by performing the average filtering operation on the 1Bnd digital signal.

The delayer 15 delays the second arithmetic signal in units of a sampling time, and outputs the delayed second arithmetic signal to the second multiplier 12.

The second multiplier 12 outputs the third arithmetic signal of N bits, which is obtained by multiplying a second coefficient and a signal output from the delayer 15, to the adder 14.

The subtractor 16 outputs a fourth arithmetic signal of N bits, corresponding to a difference between the second arithmetic signal and the target digital signal DAC_tar, to the third multiplier 13. For example, the subtractor 16 outputs the fourth arithmetic signal of N bits, which is obtained by subtracting the second arithmetic signal from the target digital signal DAC_tar, to the third multiplier 13. The MSB of the fourth arithmetic signal of N bits may indicate a polarity.

The third multiplier 13 outputs a fifth arithmetic signal, which is obtained by multiplying the fourth arithmetic signal by a third coefficient, to the barrel shifter 17.

The barrel shifter 17 outputs the second digital signal DAC_err that is obtained by shifting, at least one bit by bit, the fifth arithmetic signal to an upper bit. When the barrel shifter 17 shifts a signal to an upper bit one by one, the second digital signal DAC_err is the same as a result that is obtained by multiplying the fifth arithmetic signal by two. When the barrel shifter 17 shifts a signal to an upper bit two by two, the second digital signal DAC_err is the same as a result obtained by multiplying the fifth arithmetic signal by four. That is, when the number of bits shifted to an upper bit by the barrel shifter 17 is n, a value obtained by multiplying an input signal by $2^n$ is output.

Each of the first to third coefficients may be greater than zero and less than one.

Figure 6:
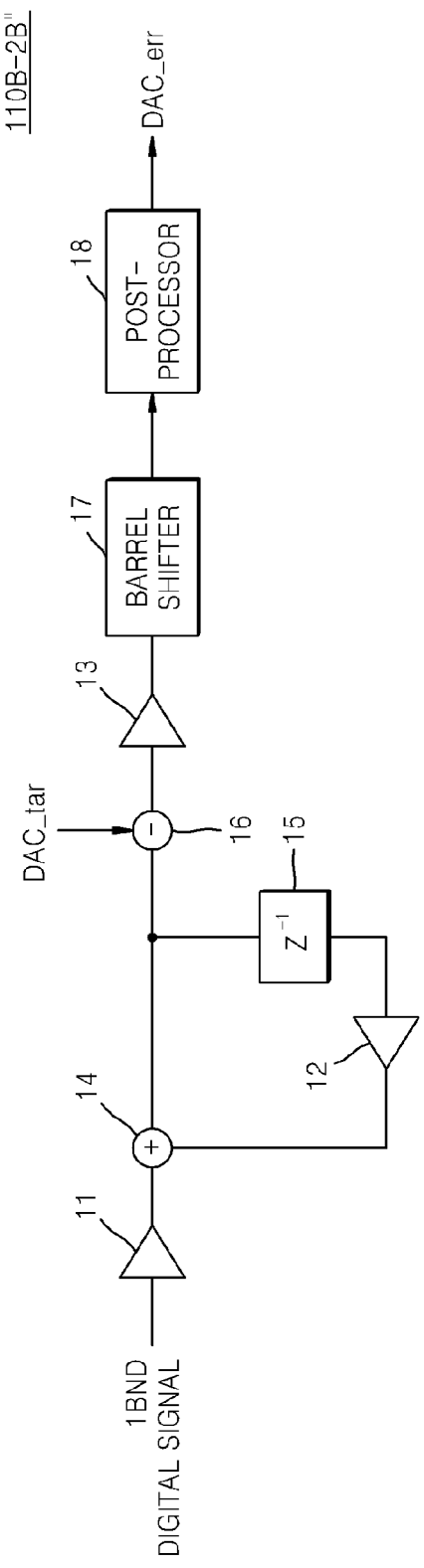
FIG. 6 is a diagram illustrating another example detailed configuration of the digital filter of FIG. 3.

FIG. 6 is a diagram illustrating another example detailed configuration of a digital filter 110-2B" of FIG. 3.

As illustrated in FIG. 6, the digital filter 110-2B" includes: first to third multipliers 11 to 13; an adder 14; a delayer 15; a subtractor 16; a barrel shifter 17; and a post-processor 18.

In comparison with the digital filter 110-2B' of FIG. 5, the digital filter 110-2B" of FIG. 6 further includes the post-processor 18.

Operations of the first to third multipliers 11 to 13, adder 14, delayer 15, subtractor 16, and barrel shifter 17 of FIG. 6 have been described above with reference to FIG. 5, and thus, only operation of the post-processor 18 will be described with regard to FIG. 6.

The post-processor 18 receives the second digital signal DAC_err output from the barrel shifter 17. When the MSB that is a polarity bit of the second digital signal DAC_err has a first logic value, the post-processor 18 inverts a value of bits of the second digital signal DAC_err, except the polarity bit, whereas when a polarity bit of the second digital signal DAC_err has a second logic value, the post-processor 18 outputs a value of bits of the second digital signal DAC_err as-is. As another example, the first logic value may be set to 0, and the second logic value may be set to 1.

Figure 7:
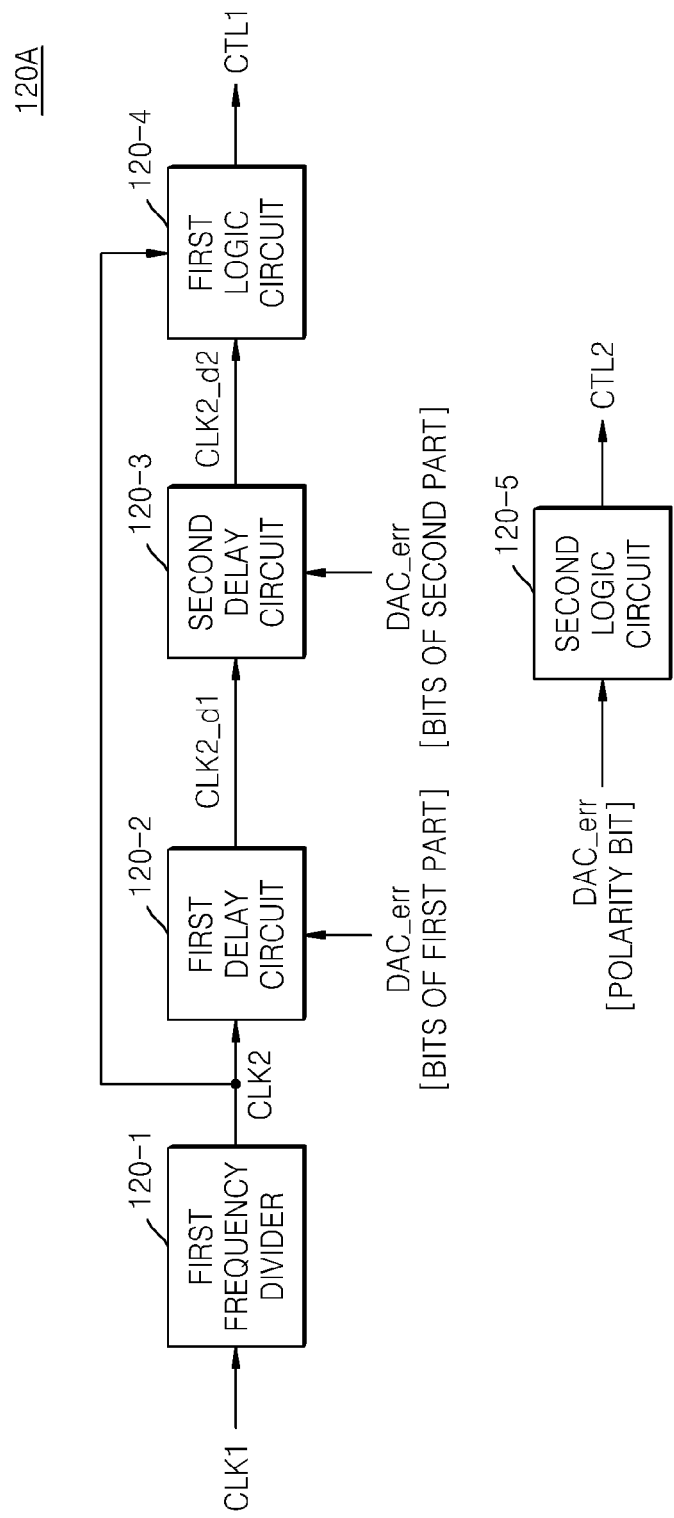
FIG. 7 is a diagram illustrating an example detailed configuration of a phase synthesis circuit of FIG. 1A or 1B.

FIG. 7 is a diagram illustrating an example detailed configuration of a phase synthesis circuit of FIG. 1A or 1B.

As illustrated in FIG. 7, a phase synthesis circuit 120A includes: a first frequency divider 120-1; a first delay circuit 120-2; a second delay circuit 120-3; a first logic circuit 120-4; and a second logic circuit 120-5.

The phase synthesis circuit 120A generates the first control signal CTL1 and the second control signal CTL2 based on the second digital signal DAC_err. For example, the second digital signal DAC_err includes bits of a first part, which is composed of the MSB indicating polarity information and an initially set number of upper bits indicating a delay value of the first delay circuit 120-2, and bits of a second part composed of an initially set number of lower bits indicating a delay value of the second delay circuit 120-3.

For example, when the second digital signal DAC_err is composed of 16 bits, the phase synthesis circuit 120A may control the first delay circuit 120-2 by using a value of [14:11] bits, and control the second delay circuit 120-3 by using a value of [10:0] bits.

The first frequency divider 120-1 receives a first clock signal CLK1 to output a second clock signal CLK2 of which a pulse is generated at every initially set two or more integer-multiple cycles of the first clock signal CLK1. A generation cycle of the second clock signal CLK2 may be determined based on the number of bits of the first part of the second digital signal DAC_err. For example, when the number of bits of the first part is four, the initially set integer multiple may be set to $2^4$. That is, when the number of bits of the first part is four, a pulse of the second clock signal CLK2 is generated at each sixteenth pulse of the first clock signal CLK1.

Figure 16:
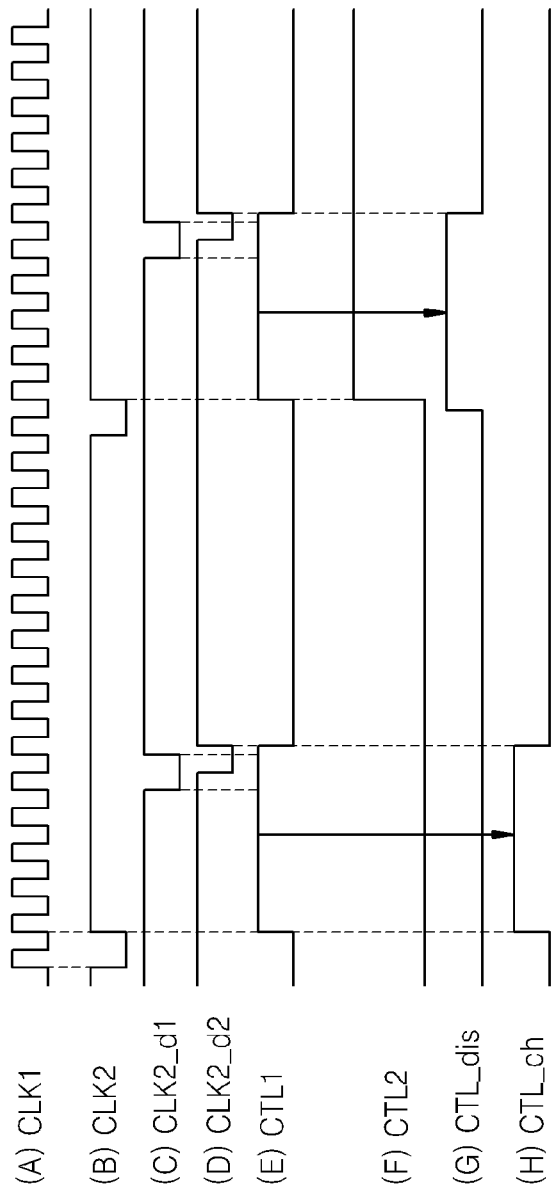
FIG. 16 illustrates example timing diagrams showing main signals generated in the digital-to-analog conversion apparatus according to an example embodiment of inventive concepts.

FIG. 16 (A) shows an example of the first clock signal CLK1, and FIG. 16 (B) shows an example of the second clock signal CLK2.

Referring to FIGS. 16 (A) and (B), the first clock signal CLK1 is input to the first frequency divider 120-1, and the pulse of the second clock signal CLK2 is generated at each sixteenth pulse of the first clock signal CLK1.

The first delay circuit 120-2 receives the second clock signal CLK2, and outputs a 2And clock signal that is obtained by delaying the second clock signal CLK2 in units of one-cycle time of the first clock signal CLK1 based on a value of the bits of the first part of the second digital signal DAC_err. For example, when the second digital signal DAC_err is composed of 16 bits, the first delay circuit 120-2 may be controlled by using the value of [14:11] bits. In a more detailed example, when the value of [14:11] bits is [0101], the second clock signal CLK2 is delayed for a time corresponding to five cycles of the first clock signal CLK1, and is output by the first delay circuit 120-2.

FIG. 16 (C) shows a 2And clock signal CLK2_d1 output by the first delay circuit 120-2 delaying the second clock signal CLK2 for a time corresponding to five cycles of the first clock signal CLK1.

The second delay circuit 120-3 receives the 2And clock signal CLK2_d1 output from the first delay circuit 120-2, and outputs a 2Bnd clock signal CLK2_d2 that is obtained by delaying the 2And clock signal CLK2_d1 in units of an initially set resolution time according to clock skew control based on a value of the bits of the second part of the second digital signal DAC_err. For example, the resolution time unit set to an initial value may be determined as a time unit in which a one-cycle time unit of the first clock signal is divided by $2^K$ (where K is the number of bits of the second part). As another example, the resolution time unit set to the initial value may be greater or less than the time unit in which the one-cycle time unit of the first clock signal is divided by $2^K$ (where K is the number of bits of the second part).

FIG. 16D shows the 2Bnd clock signal CLK2_d2.

The first logic circuit 120-4 generates the first control signal CTL1 having a pulse width corresponding to a sum of delay values in the first and second delay circuits 120-2 and 120-3, based on the second clock signal CLK2 and the 2Bnd clock signal CLK2_d2. For example, the first logic circuit 120-4 may generate the first control signal CTL1 having an interval width from a time when the second clock signal CLK2 is generated to a time when the 2Bnd clock signal CLK2_d2 is generated.

The second logic circuit 120-5 generates the second control signal CTL2 having a logic value corresponding to polarity bit information included in the second digital signal DAC_err. For example, the second logic circuit 120-5 may generate the second control signal CTL2 having a logic value corresponding to an MSB value indicating the polarity information of the second digital signal DAC_err.

As another example, a polarity output bit of the second digital signal DAC_err generated by the analog-to-digital conversion processing circuit 110 may be directly used as the second control signal CTL2 without being transferred to the second logic circuit 120-5. In more detail, a MSB output indicating the polarity information of the second digital signal DAC_err may be directly used as the second control signal CTL2. In this case, the second logic circuit 120-5 may be omitted.

Figure 8:
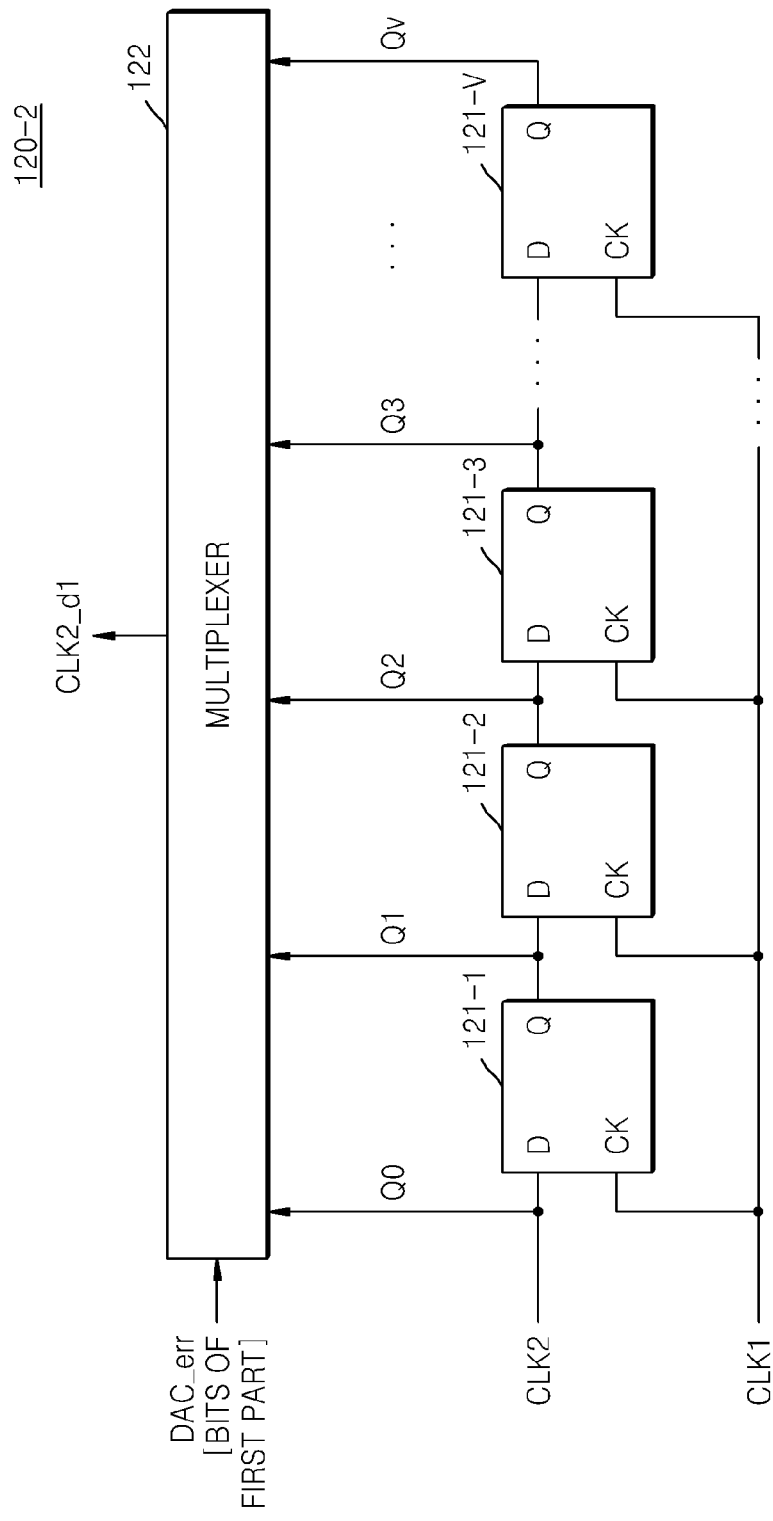
FIG. 8 is a diagram illustrating an example detailed configuration of a first delay circuit of FIG. 7.

FIG. 8 is a diagram illustrating an example detailed configuration of a first delay circuit 120-2 of FIG. 7.

As illustrated in FIG. 8, the first delay circuit 120-2 includes a plurality of D flip-flops 121-1 to 121-v and a multiplexer 122.

The number "v" of D flip-flops is determined based on the value of the bits of the first part of the second digital signal DAC_err. For example, when the number of bits of the first part is four, the number "v" of D flip-flops is determined as fifteen (i.e., $2^4-1$).

The plurality of D flip-flops 121-1 to 121-v are connected in series. In more detail, the second clock signal CLK2 is applied to an input terminal D of a first D flip-flop 121-1, and an output terminal Q of the first D flip-flop 121-1 is connected to an input terminal D of a next D flip-flop 121-2. In this way, the input terminals D and output terminals Q of the D flip-flops 121-1 to 121-v are connected.

The first clock signal CLK1 is applied to each of clock terminals CK of the D flip-flops 121-1 to 121-v.

Therefore, the first D flip-flop 121-1 outputs the second clock signal CLK2 obtained by delaying the first clock signal CLK1 during one cycle, the second D flip-flop 121-2 outputs the second clock signal CLK2 obtained by delaying the first clock signal CLK1 during two cycles, and the last D flip-flop 121-v outputs the second clock signal CLK2 obtained by delaying the first clock signal CLK1 during v cycles.

An input signal Q0 of the first D flip-flop 121-1 and signals Q1 to Qv, respectively output from the D flip-flops 121-1 to 121-v, are input to the multiplexer 122.

The multiplexer 122 selects one signal from among the signals Q0 to Qv, which are respectively input to v+1 number of input terminals of the multiplexer 122, based on the value of the first part of the second digital signals DAC_err, and outputs the selected signal.

For example, when the value of the first part of the second digital signals DAC_err is [14:11] and the value of [14:11] bits is [0000], the multiplexer 122 selects and outputs the signal Q0. As another example, when a value of [14:11] bits is [0101], the multiplexer 122 selects and outputs the signal Q5.

Figure 9:
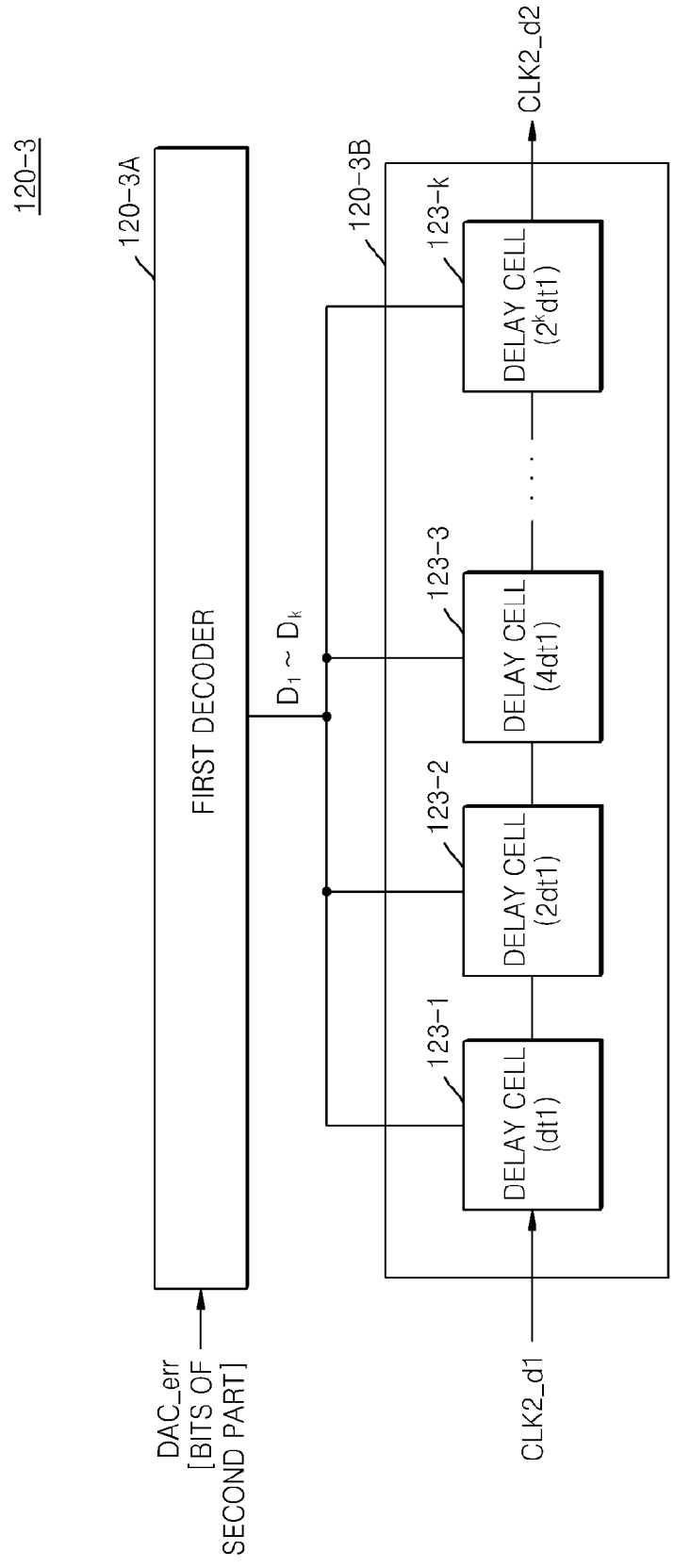
FIG. 9 is a diagram illustrating an example detailed configuration of a second delay circuit of FIG. 7.

FIG. 9 is a diagram illustrating an example detailed configuration of a second delay circuit 120-3 of FIG. 7.

As illustrated in FIG. 9, the second delay circuit 120-3 includes a first decoder 120-3A and a first delay chain 120-3B.

The first delay chain 120-3B has a circuit configuration in which a plurality of delay cells 123-1 to 123-k are connected in series. A first delay chain 120-3B receives the 2And clock signal CLK2_d1, and outputs the 2Bnd clock signal CLK2_d2 obtained through delay by the delay cells 123-1 to 123-k, based on a plurality of first decoding signals D1 to Dk.

The number "k" of the delay cells 123-1 to 123-k is the same as the number of bits of the second part of the second digital signal DAC_err. For example, when [10:0] bits of the second digital signal DAC_err are allocated as the bits of the second part, the number "k" of the delay cells 123-1 to 123-k may be eleven. The delay cells 123-1 to 123-k are controlled according to the first decoding signals D1 to Dk generated by the first decoder 120-3A.

When a delay time in the delay cell 123-1 corresponding to the least significant bit (LSB) is determined as a first unit delay time dt1, a delay time in the delay cell 123-2 corresponding to a second upper bit is determined as 2*dt1, and a delay time in the delay cell 123-3 corresponding to a third upper bit is determined as 4*dt1. In this way, a delay time of each delay cell increases by two times whenever a bit sequence ascends by one bit.

For example, when the first unit delay time dt1, that is the delay time in the delay cell 123-1 corresponding to the LSB, is determined as 125 ps, the delay time in the delay cell 123-2 corresponding to the second upper bit may be about 0.25 ns, and a delay time in the delay cell 123-11 corresponding to an eleventh upper bit may be about 32 ns.

The first decoder 120-3A generates the first decoding signals D1 to Dk that are used to select delay cells configuring the delay chain 120-3A, based on the value of the bits of the second part composing the second digital signal DAC_err. A first decoding value of the first decoder 120-3A may be determined as the same value as the value of the bits of the second part of the second digital signal DAC_err. For example, when the value of the bits of the second part of the second digital signal DAC_err is [01000000011], the first decoding value may be determined as [01000000011]. In addition, the first decoder 120-3A may generate a plurality of first decoding signals D1 to D11 based on the first decoding value [01000000011]. The first decoding signals D1 to Dk respectively match a plurality of delay cells in one-to-one correspondence relationship.

A delay cell(s), which is (are) selected from among the delay cells configuring the first delay chain 120-3A based on values of the first decoding signals D1 to Dk, delays an input signal during a delay time of a corresponding delay cell, and outputs the delayed signal. A delay cell(s), which is (are) not selected from among the delay cells configuring the first delay chain 120-3A, delays an input signal during a second unit delay time dt2. Here, the second unit delay time dt2 is set to a value that is less than the first unit delay time dt1. The second unit delay time dt2 may be set to a relatively small value that is negligible (or ignorable) in comparison with the first unit delay time dt1.

For example, when a value of [10:0] bits of the second digital signal DAC_err is [01000000011], the delay cells 123-1, 123-2 and 123-10 are selected by the first decoding signals D1 to Dk. If a unit delay time is ignored, a total delay time in the delay chain 120-3A is a sum of delay times of the three delay cells 123-1, 123-2 and 123-10.

Figure 10:
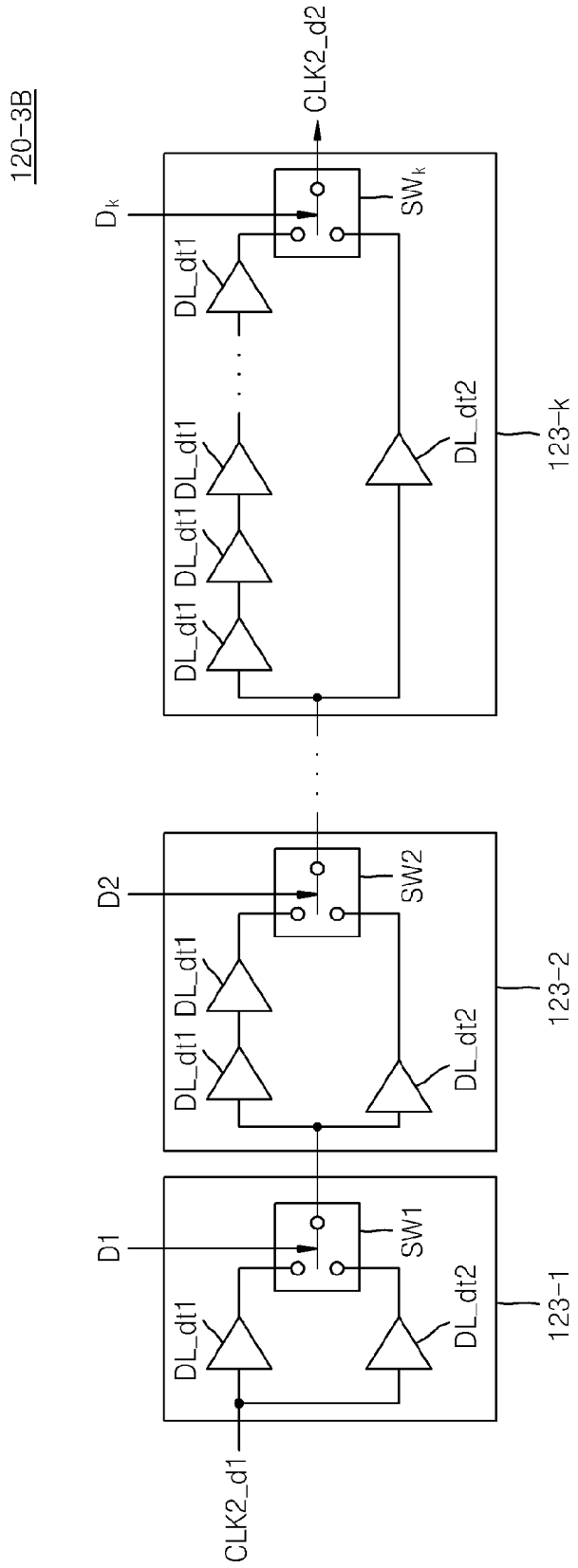
FIG. 10 is a diagram illustrating an example detailed configuration of a delay chain of FIG. 9.

FIG. 10 is a diagram illustrating an example detailed configuration of the first delay chain 120-3B of FIG. 9.

As illustrated in FIG. 10, the first delay chain 120-3B includes the plurality of delay cells 123-1 to 123-k connected in series. In each of the plurality of delay cells 123-1 to 123-k, a switch SWi selects one of a first terminal, which is serially connected to a number of delayers DL_dt1 having the first unit delay time dt1 and corresponding to a delay time of a corresponding delay cell, and a second terminal of a delayer DL_dt2, which is connected in parallel with the first terminal and has the second unit delay time dt2, and a signal is output through the selected terminal. The switch SWi is controlled according to the first decoding signal Di, which is generated by the decoder 120-3A based on the bits of the first part of the second digital signal DAC_err.

In more detail, the delay cell 123-1 includes: one delayer DL_dt1 that delays an input signal during the first unit delay time dt1 to output the delayed signal; one delayer DL_dt2 that is connected in parallel with the delayer DL_dt1 and delays an input signal during the second unit delay time dt2 to output the delayed signal; and a switch SW1. The switch SW1 selects one of the delayers DL_dt1 and delayer DL_dt2, and a signal is output from the selected delayer. The switch SW1 is controlled according to the first decoding signal D1 corresponding to the LSB of the bits of the first part of the second digital signal DAC_err. For example, when the first decoding signal D1 has a first logic value (e.g., 1), the delay cell 123-1 selects and outputs a signal that is obtained through delay by the delayer DL_dt1. When the first decoding signal D1 has a second logic value (e.g., 0), the delay cell 123-1 selects and outputs a signal that is obtained through delay by the delayer DL_dt2.

The delay cell 123-$k$ includes: $2^k$ delayers DL_dt1, which are connected in series; one delayer DL_dt2; and a switch SWk. The switch SWk selects one of a first terminal (through which a signal, which is obtained through delay by the serially connected $2^k$ delayers DL_dt1) and a second terminal (through which a signal, which is obtained through delay by one delayer DL_dt2 connected in parallel with the first terminal). The switch SWk is controlled according to the first decoding signal Dk corresponding to the MSB of the bits of the first part of the second digital signal DAC_err. For example, when the first decoding signal Dk has the first logic value (e.g., 1), the delay cell 123-$k$ selects the first terminal so as to output a signal that is obtained through delay by the $2^k$ delayers DL_dt1. When the first decoding signal Dk has the second logic value (e.g., 0), the delay cell 123-$k$ selects the second terminal so as to output a signal that is obtained through delay by the delayer DL_dt2.

Figure 11:
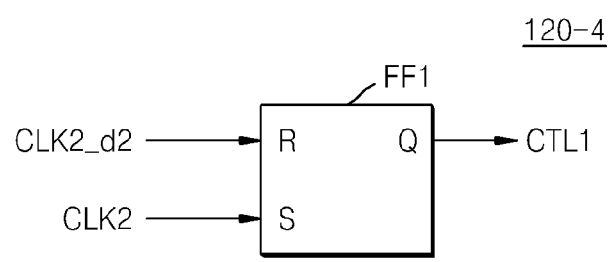
FIG. 11 is a diagram illustrating an example detailed configuration of a first logic circuit of FIG. 7.

FIG. 11 is a diagram illustrating an example detailed configuration of a first logic circuit 120-4 of FIG. 7.

As illustrated in FIG. 11, the first logic circuit 120-4 may be implemented by a first RS flip-flop FF1.

The 2Bnd clock signal CLK2_d2 output from the second delay circuit 120-3 is applied to an R terminal of the first RS flip-flop FF1, and the second clock signal CLK2 output from the first frequency divider 120-1 is applied to an S terminal of the first RS flip-flop FF1.

For example, when the second clock signal CLK2 is generated to have the timing shown in FIG. 16 (B) and the 2Bnd clock signal CLK2_d2 is generated to have the timing shown in FIG. 16 (D), the first control signal CTL1 output through the output terminal Q of the first RS flip-flop FF1 is generated as shown in FIG. 16 (E).

Figure 12:
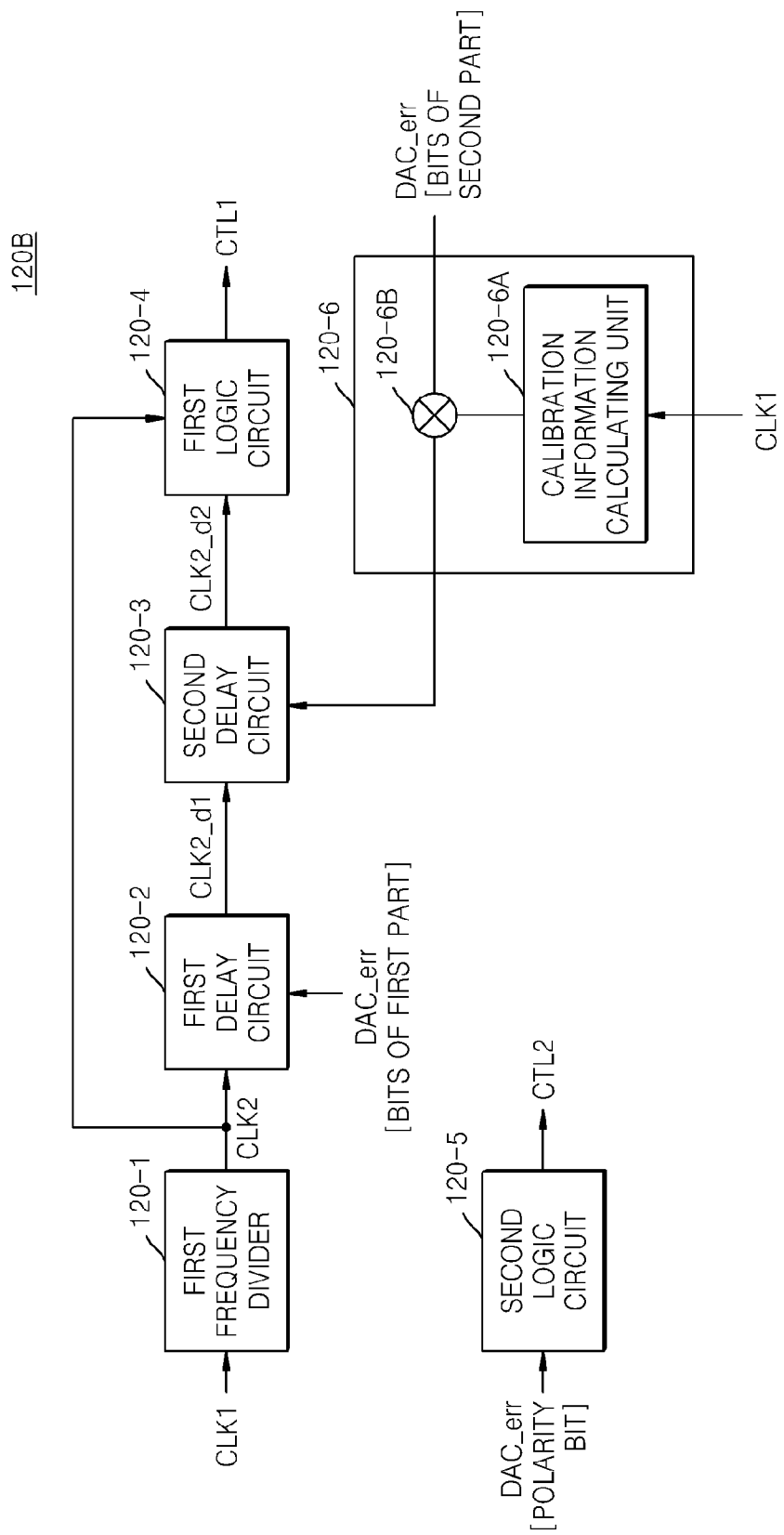
FIG. 12 is a diagram illustrating another example detailed configuration of the phase synthesis circuit of FIG. 1A or 1B.

FIG. 12 is a diagram illustrating another example detailed configuration of the phase synthesis circuit of FIG. 1.

As illustrated in FIG. 12, the phase synthesis circuit 120B includes: a first frequency divider 120-1; a first delay circuit 120-2; a second delay circuit 120-3; a first logic circuit 120-4; a second logic circuit 120-5; and a calibration circuit 120-6.

The phase synthesis circuit 120B has a configuration in which the calibration circuit 120-6 is added to the phase synthesis circuit 120A of FIG. 7. The first frequency divider 120-1, the first delay circuit 120-2, the second delay circuit 120-3, the first logic circuit 120-4, and the second logic circuit 120-5 have been described above with reference to FIG. 7, and thus, repetitive descriptions are not provided here.

The calibration circuit 120-6 includes a calibration information calculating circuit 120-6A and a fourth multiplier 120-6B.

The calibration information calculating circuit 120-6A calculates a skew calibration value corresponding to a value that is delayed during one cycle of the first clock signal CLK1 in a circuit equivalent to the second delay circuit 120-3 of FIG. 9. Here, the skew calibration value is a value equal or substantially equal to a skew value of the first clock signal CLK1 that is generated by the second delay circuit 120-3.

The fourth multiplier 120-6B multiplies the bits of the second part of the second digital signal DAC_err input to the phase synthesis circuit 120B by the skew calibration value to output a normalized value of the bits of the second part. The normalized value of the bits of the second part, which is output from the fourth multiplier 120-6B, is applied to the second delay circuit 120-3.

Therefore, a change amount of delay that is caused by a process characteristic and/or a voltage variation in the second delay circuit 120-3 is counteracted.

Figure 13:
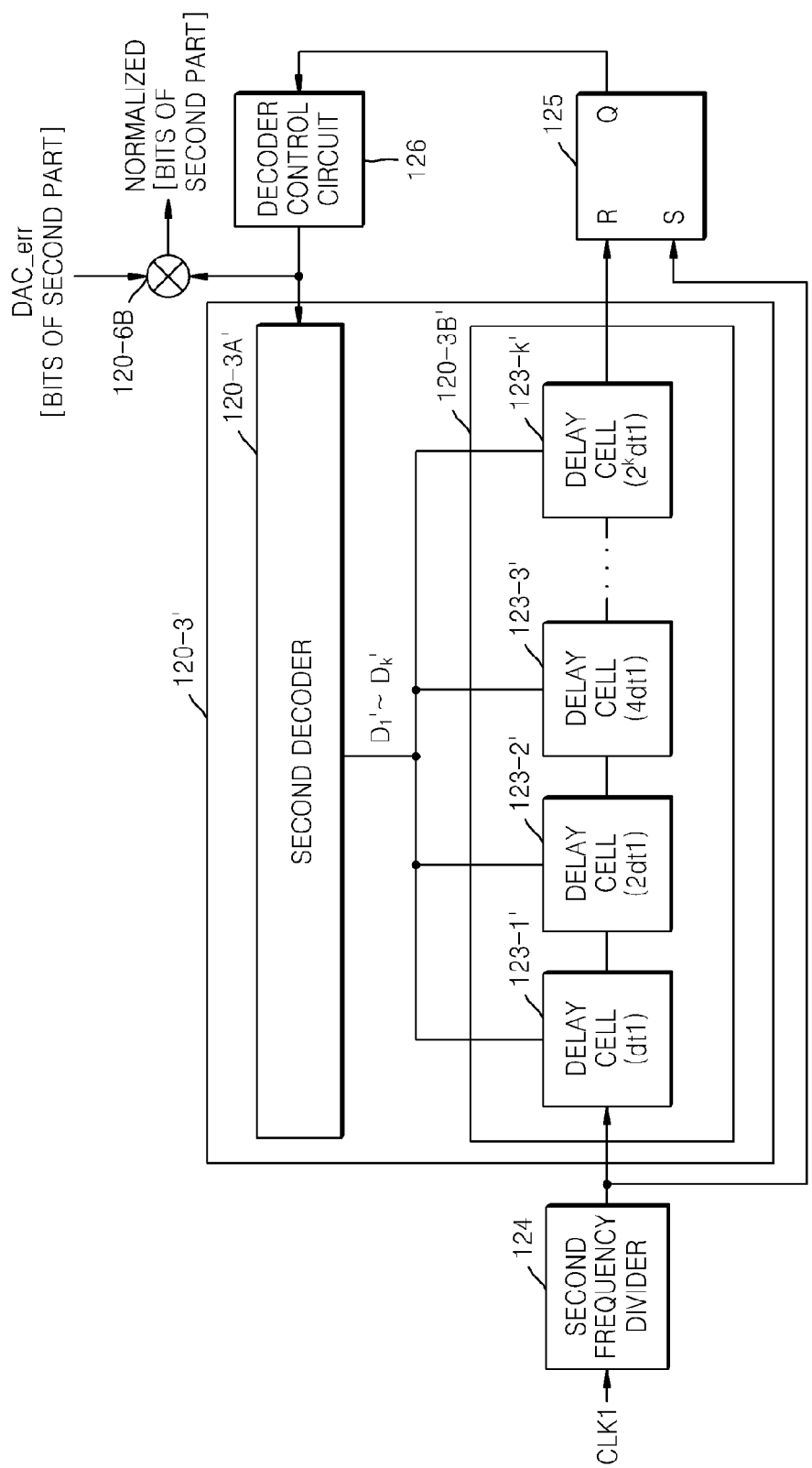
FIG. 13 is a diagram illustrating an example detailed configuration of a calibration circuit of FIG. 12.

FIG. 13 is a diagram illustrating an example detailed configuration of the calibration circuit 120-6 of FIG. 12.

As illustrated in FIG. 13, the calibration circuit 120-6 includes: a 2'nd delay circuit 120-3; a second frequency divider 124; an RS flip-flop 125; a decoder control circuit 126; and the fourth multiplier 120-6B.

The second frequency divider 124 receives the first clock signal CLK1, and divides a frequency of the first clock signal CLK1 by two. For example, when the frequency of the first clock signal CLK1 is about 32 MHz, the second frequency divider 124 outputs a clock signal of about 16 MHz. A signal output from the second frequency divider 124 is referred to as a 1And clock signal CLK1A.

The 2'nd delay circuit 120-3' is configured as a circuit equivalent to the second delay circuit of FIG. 9. The 2'nd delay circuit 120-3' includes a second decoder 120-3A' and a second delay chain 130-3B'. The second delay chain 120-3B' includes a plurality of delay cells 123-1' to 123-$k$' connected in series.

The 1And clock signal CLK1A is input to the second delay chain 130-3B'. The second delay chain 130-3B' controls the delay cells 123-1' to 123-$k$' according to a plurality of second decoding signals D1' to Dk' output from the second decoder 120-3A', thereby delaying the 1And clock signal CLK1A. A signal output from the second delay chain 130-3B' is defined as a 1Bnd clock signal CLK1A_d.

The 1Bnd clock signal CLK1A_d is applied to an R terminal of the RS flip-flop 125, and the 1And clock signal CLK1A is applied to an S terminal of the RS flip-flop 125. A signal output through an output terminal Q of the RS flip-flop 125 is applied to the decoder control circuit 126.

The decoder control circuit 126 increases or decreases a second decoding value, which is set to a default value of the second decoder 120-3A', based on a logic value of the signal, which is output through the Q terminal of the RS flip-flop 125, thereby generating a skew calibration value. The decoder control circuit 126 may increase or decrease, by one, the second decoding value composed of k bits based on the logic value of the signal which is output through the Q terminal.

The second decoder 120-3A' outputs the second decoding signals D1' to Dk', corresponding to the second decoding value, which is obtained through control by the decoder control circuit 126, to the second delay chain 130-3B'.

In more detail, the second logic value (e.g., 0) is output through the Q terminal of the RS flip-flop 125 according to an initial skew value in the second delay chain 130-3B'. When the second logic value (e.g., 0) is applied to the decoder control circuit 123, the decoder control circuit 123 increases the second decoding value. The second decoding value increases until the first logic value (e.g., 1) is applied from the RS flip-flop 125 to the decoder control unit 126. When the first logic value (e.g., 1) is applied from the RS flip-flop 125 to the decoder control circuit 126, the decoder control circuit 123 decreases the second decoding value.

Therefore, an up/down operation is repeated for the second decoding value of the second decoder 120-3A' corresponding to a value that is delayed during one cycle of the first clock signal CLK1 in the 2'nd delay circuit 120-3', and thus, the second decoding value converges. The converged second decoding value is the skew calibration value.

The fourth multiplier 120-6B multiplies the bits of the second part of the second digital signal DAC_err input to the phase synthesis circuit 120B by the skew calibration value, which is generated by the decoder control circuit 123, thereby outputting a normalized value of the bits of the second part. The normalized value of the bits of the second part, which is output from the fourth multiplier 120-6B, is applied to the second delay circuit 120-3.

Figure 14:
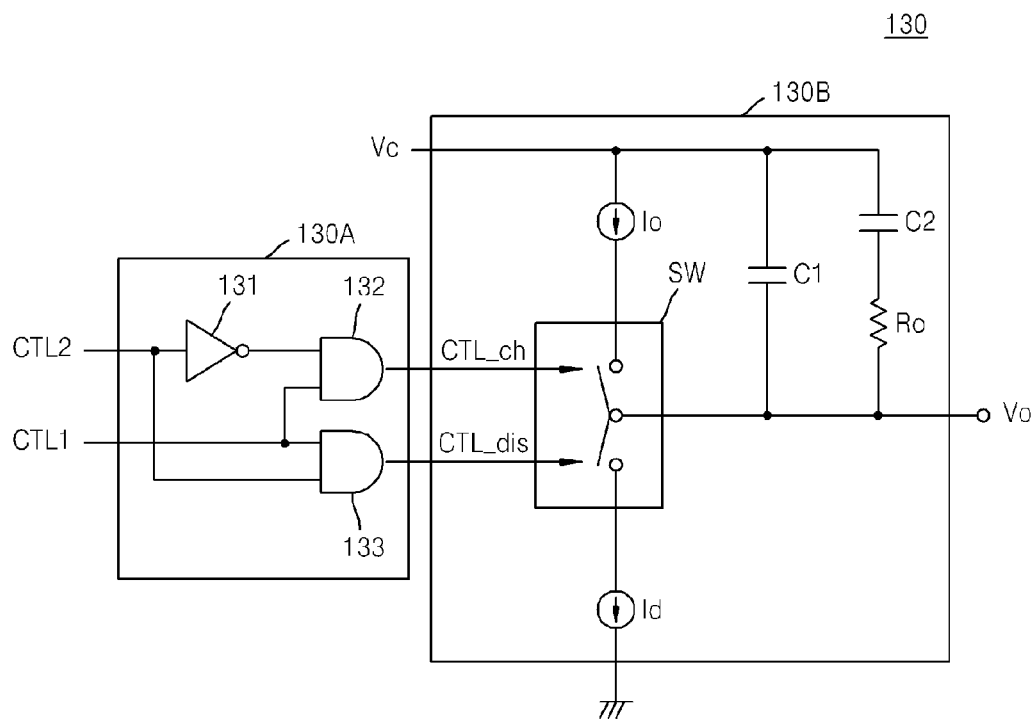
FIG. 14 is a diagram illustrating an example detailed configuration of a charge pump circuit of FIG. 1A or 1B.

FIG. 14 is a diagram illustrating an example detailed configuration of the charge pump circuit 130 of FIG. 1A or 1B.

As illustrated in FIG. 14, the charge pump circuit 130 includes a pre-processing circuit 130A and a charge pump 130B.

In at least this example embodiment, the pre-processing circuit 130A is described as being included in the charge pump circuit 130, but example embodiments are not limited thereto. In another example, the pre-processing circuit 130A may be separate from the charge pump circuit 130. In yet another example, the pre-processing circuit 130A may be included in the phase synthesis circuit 120.

The pre-processing circuit 130A generates a charge control signal CTL_ch and a discharge control signal CTL_dis, which are used to switch between a charge operation and a discharge operation of the charge pump 130B, by using the first and second control signals CTL1 and CTL2 input from the phase synthesis circuit 120.

For example, the pre-processing circuit 130A is configured with an inverter 131 and first and second AND gates 132 and 133.

The second control signal CTL2 is applied to an input terminal of the inverter 131 and a second input terminal of the second AND gate 133. The first control signal CTL1 is applied to a second input terminal of the first AND gate 132 and a first input terminal of the second AND gate 133. An output signal of the inverter 131 is applied to the first input terminal of the first AND gate 132.

Therefore, when a logic level of the second control signal CTL2 is 0 and a logic level of the first control signal CTL1 is 1, the first AND gate 132 outputs a first charge control signal CTL_ch having a logic level of 1. Otherwise, the first AND gate 132 outputs the first charge control signal CTL_ch having a logic level of 0.

For example, when the second clock signal CLK2 is generated to have the timing shown in FIG. 16 (F) and the first clock signal CLK1 is generated to have the timing shown in FIG. 16 (E), the first charge control signal CTL_ch is generated to have the timing shown in FIG. 16 (H).

When the logic level of the second control signal CTL2 is 1 and the logic level of the first control signal CTL1 is 1, the second AND gate 133 outputs a first discharge control signal CTL_dis having a logic level of 1. Otherwise, the second AND gate 133 outputs the first discharge control signal CTL_dis having a logic level of 0.

For example, when the second clock signal CLK2 is generated to have the timing shown in FIG. 16 (F) and the first clock signal CLK1 is generated to have the timing shown in FIG. 16 (E), the first discharge control signal CTL_dis is generated to have the timing shown in FIG. 16 (G).

The charge pump 130B includes: a switch SW; a source current source Io; a sink current source Id; capacitors C1 and C2; and a resistor Ro. Vc refers to a source voltage that is applied to the digital-to-analog conversion apparatus 100A or 100B.

When a charge loop is selected in the charge pump 130B, the source current source Io is turned on, and the sink current source Id is turned off. When a discharge loop is selected in the charge pump 130B, the sink current source Id is turned on, and the source current source Io is turned off.

When the first charge control signal CTL_dis having a logic level of 1 is applied from the pre-processing circuit 130A to the switch SW, the switch SW forms the charge loop in the charge pump 130B. When the charge loop is formed, the source current source Io is turned on, and the sink current source Id is turned off. Therefore, a current output from the source current source Io is supplied to the capacitors C1 and C2. Accordingly, the capacitors C1 and C2 are charged, and thus, an output voltage Vo of the charge pump 130B increases. The output voltage Vo of the charge pump 130B increases in proportion to a length of an interval in which the charge pump is formed. Here, the length of the interval in which the charge pump is formed is determined based on a length of an interval in which a logic level of 1 is maintained.

When the first discharge control signal CTL_dis having a logic level of 1 is applied from the pre-processing circuit 130A to the switch SW, the switch SW forms the discharge loop in the charge pump 130B. When the discharge loop is formed, the sink current source Id is turned on, and the source current source Io is turned off. Therefore, the charged voltages of the capacitors C1 and C2 are discharged through a ground terminal. That is, a discharged current flows to the ground terminal through the sink current source Id. Accordingly, since the charged voltages of the capacitors C1 and C2 are discharged, the output voltage Vo of the charge pump 130B decreases. The output voltage Vo of the charge pump 130B increases in proportion to a length of an interval in which the discharge pump is formed. Here, the length of the interval in which the discharge pump is formed is determined based on a length of the interval in which a logic level of 1 is maintained.

All the charge loop and discharge loop of the charge pump 130B are opened in an interval where all the charge control signal CTL_ch and the discharge control signal CTL_dis maintain a logic level of 0. When a leakage current is ignored in an interval where the charge loop and the discharge loop are open, the output voltage Vo of the charge pump 130B does not vary. A voltage of the output terminal of the digital-to-analog conversion apparatus 100A of FIG. 1A is the output voltage Vo of the charge pump circuit 130.

Figure 17:
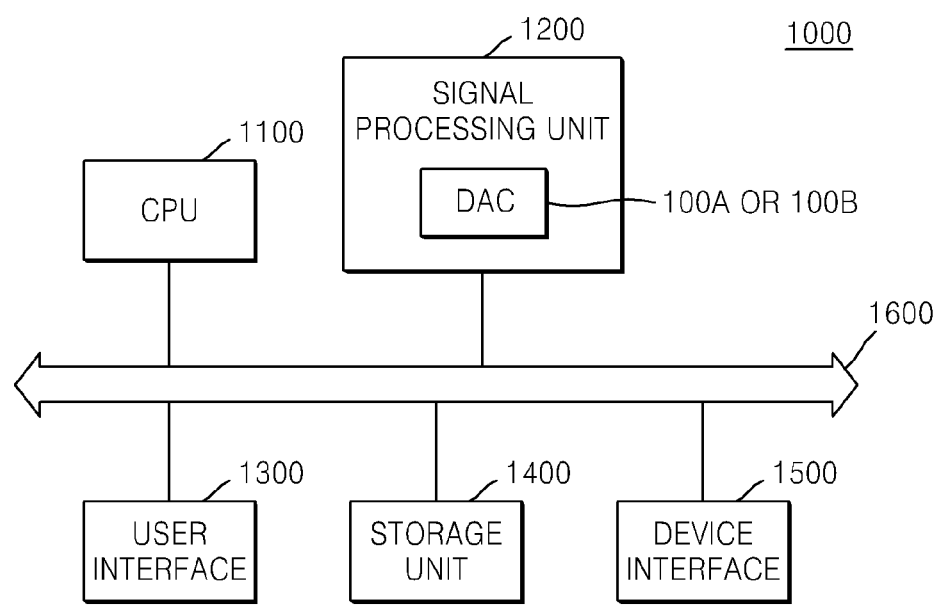
FIG. 17 is a diagram illustrating an implementation example of an electronic device to which the digital-to-analog conversion apparatus according to example embodiments of inventive concepts may be applied.

FIG. 17 is a diagram illustrating an implementation example of an electronic device 1000 to which the digital-to-analog conversion apparatus according to example embodiments of inventive concepts may be applied.

As illustrated in FIG. 17, the electronic device 1000 includes: a central processing circuit (CPU) 1100; a signal processing circuit 1200; a user interface 1300; a storage unit or device 1400; a device interface 1500; and a bus 1600.

Examples of the electronic device 1000 may include: a computer; a mobile phone; a personal digital assistant (PDA); a portable multimedia player (PMP); an MP3 player; a camera; a camcorder; a television (TV); a smart TV; a display apparatus; etc.

The CPU 1100 controls an overall operation of the electronic device 1000. For example, the elements of the electronic device 1000 may be controlled based on information input through the user interface 1300.

The signal processing circuit 1200 processes a signal received through the device interface 1500, or a signal read from the storage unit 1400, according to a given (or alternatively desired or predetermined) standard. For example, a video signal processing operation or an audio signal processing operation may be performed. The digital-to-analog conversion apparatus (DAC) 100A or 100B according to example embodiments of inventive concepts may be included in the signal processing circuit 1200. For example, the digital-to-analog conversion apparatus 100A or 100B may be applied to the video signal processing operation, audio signal processing operation, and/or source voltage signal processing operation of the electronic device 1000.

The user interface 1300 is an input device that is used by a user to set information necessary for the function setting and operation of the electronic device 1000.

The storage unit 1400 stores various pieces of information necessary for the operation of the electronic device 1000. Also, the storage unit 1400 may store data received through the device interface 1500, or data obtained through processing by the electronic device 1000.

The device interface 1500 performs data communication with an external device which is connected (e.g., through a wired or wireless connection) to the electronic device 1000.

The bus 1600 performs a function of interfacing information between the elements of the electronic device 1000.

Hereinafter, a digital-to-analog conversion method according to an example embodiment of inventive concepts, which is performed in the electronic device 1000 of FIG. 17, will be described in detail.

Figure 18:
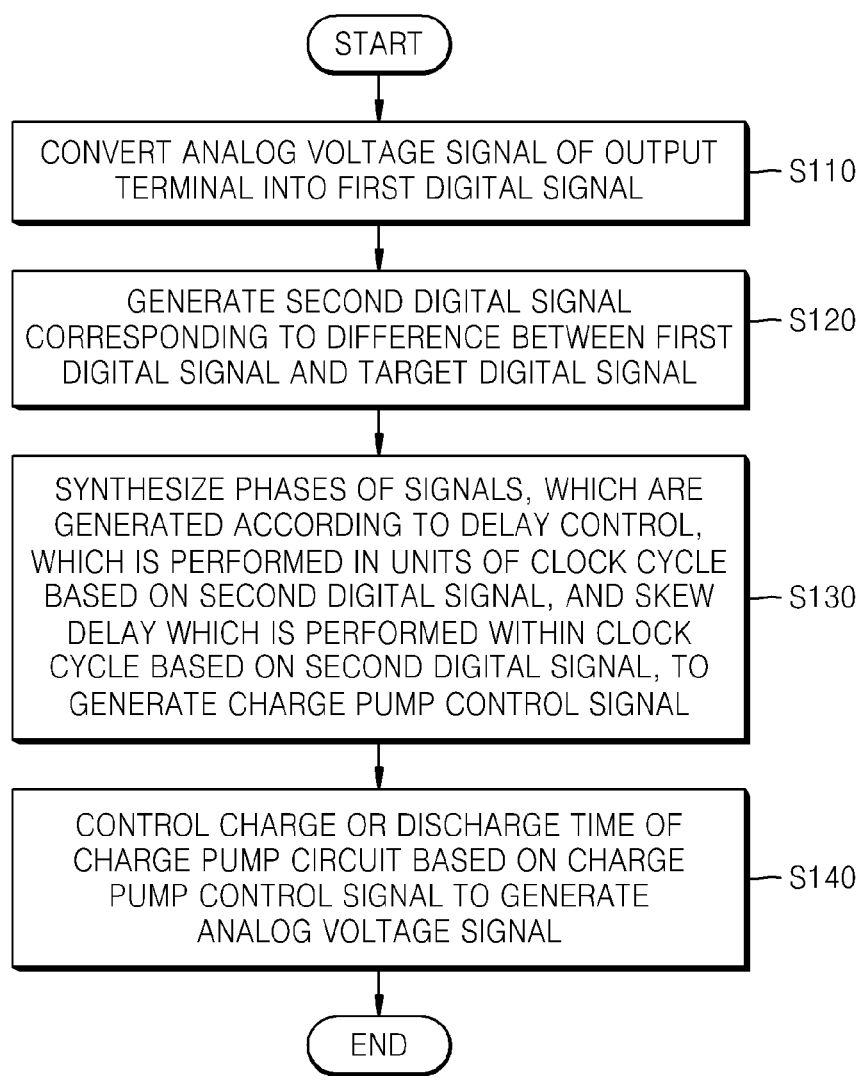
FIG. 18 is a flowchart illustrating a digital-to-analog conversion method according to another example embodiment of inventive concepts.

FIG. 18 is a flowchart illustrating a digital-to-analog conversion method according to another example embodiment of inventive concepts.

Referring to FIG. 18, in operation S110, the electronic device 1000 performs a signal processing operation that converts an analog voltage signal of an output terminal into a first digital signal. For example, the output terminal may be the output terminal of the digital-to-analog conversion apparatus.

In operation S120, the electronic device 1000 performs an operation that generates the second digital signal DAC_err corresponding to a difference between the first digital signal and the target digital signal DAC_tar. Here, the second digital signal DAC_err denotes a digital error signal. For example, the second digital signal DAC_err may include a bit indicating polarity information, and bits indicating error information. In more detail, the MSB of the second digital signal DAC_err may indicate the polarity information, and bits other than the MSB may indicate the error information.

In operation S130, the electronic device 1000 performs an operation that synthesizes phases of signals that are generated according to delay control (performed in units of a clock cycle) and skew control (performed within the clock cycle) that are performed based on the error information included in the second digital signal DAC_err, thereby generating a charge pump control signal. For example, the charge pump control signal may include the second control signal CTL2 having a logic level corresponding to the polarity information included in the second digital signal DAC_err, and the first control signal CTL1 having a pulse width corresponding to the error information included in the second digital signal DAC_err.

In operation S140, the electronic device 1000 performs an operation that controls a charge or discharge time of the charge pump circuit according to the charge pump control signal to generate an analog voltage signal. The electronic device 1000 selectively forms the charge loop or discharge loop of the charge pump circuit on the basis of a logic level of the second control signal CTL2, and allows a current to flow in a selected loop during an interval corresponding to a pulse width of the first control signal CTL1. Through such an operation, the charge pump circuit outputs an analog signal.

Figure 19:
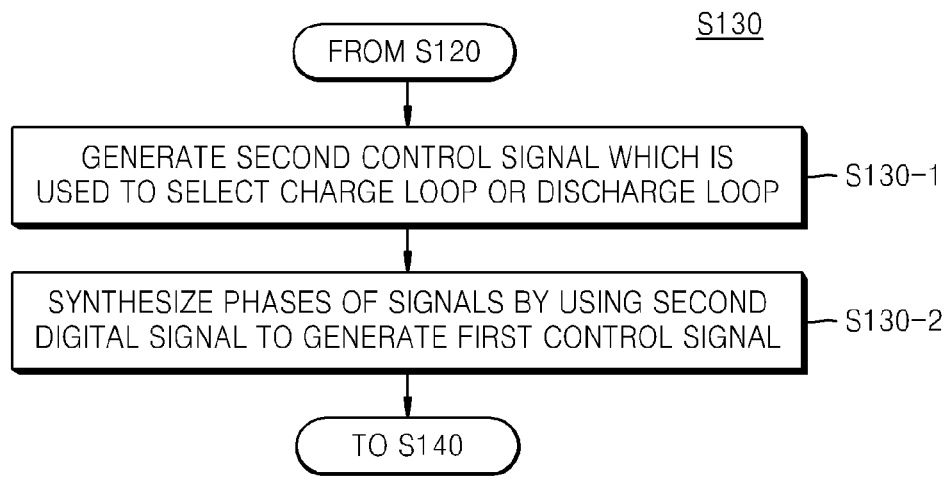
FIG. 19 is a flowchart illustrating an example embodiment of a method of generating an analog signal at S130 in FIG. 18.

FIG. 19 is a flowchart illustrating an example embodiment of operation S130 of generating an analog signal shown in FIG. 18.

Referring to FIG. 19, in operation S130-1, the electronic device 1000 performs an operation that generates the second control signal CTL2, which is used to select the charge loop or discharge loop of the charge pump circuit, based on polarity bit information included in the second digital signal DAC_err. For example, the second control signal CTL2 may be generated as an output of the MSB indicating the polarity information of the second digital signal DAC_err.

In operation S130-2, the electronic device 1000 performs an operation that generates the first control signal CTL1 by performing a phase synthesis operation using the second digital signal DAC_err. For example, the electronic device 1000 may generate the first control signal CTL1 by synthesizing phases of signals that are generated according to delay control, which is performed in units of a clock cycle based on the value of the bits of the first part of the second digital signal DAC_err, and skew control (performed within the clock cycle) that is performed based on the value of the bits of the second part of the second digital signal DAC_err. In more detail, the electronic device 1000 may generate the first control signal CTL1 having a pulse width corresponding to the error information included in the second digital signal DAC_err.

Figure 20:
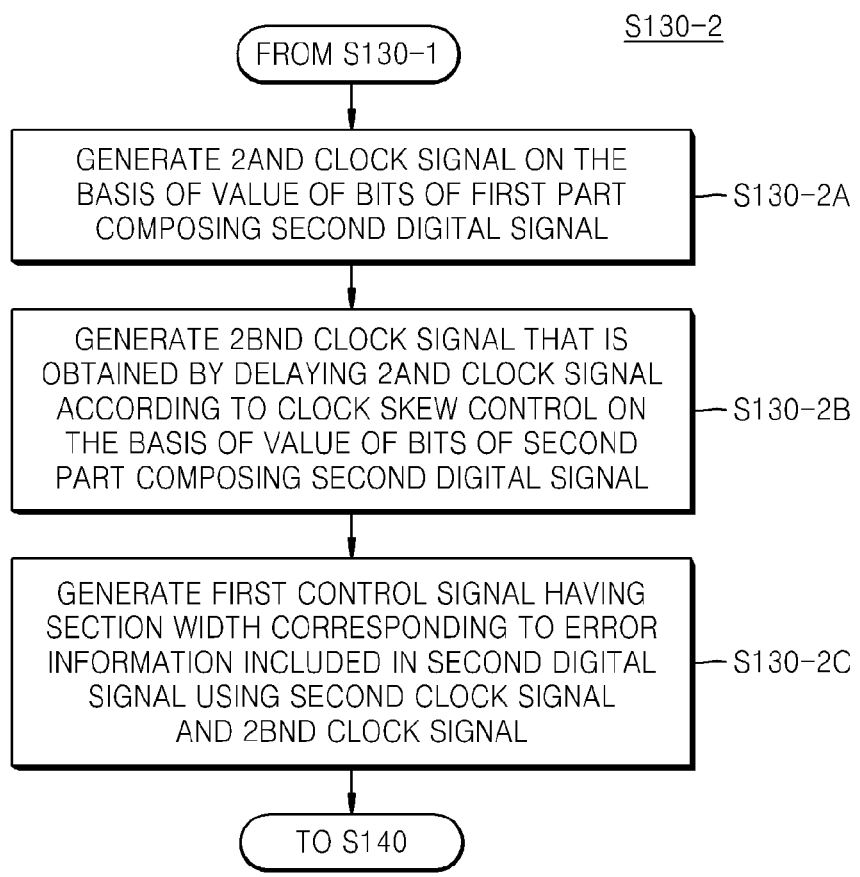
FIG. 20 is a flowchart illustrating an example embodiment of a method of generating a first control signal at S130-2 in FIG. 19.

FIG. 20 is a flowchart illustrating an example embodiment of operation S130-2 of generating the first control signal CTL1 shown in FIG. 19.

Referring to FIG. 20, in operation S130-2A, the electronic device 1000 generates the 2And clock signal CLK2_d1 that is obtained by delaying the second clock signal CLK2 based on the value of the bits of the first part of the second digital signal DAC_err. For example, the electronic device 1000 generates the 2And clock signal CLK2_d1 that is obtained by delaying the second clock signal CLK2 in units of one-cycle time of the first clock signal CLK1 based on the value of the bits of the first part of the second digital signal DAC_err. The second clock signal CLK2 is a signal of which a pulse is generated at every initially set two or more integer-multiple cycles of the first clock signal CLK1.

In operation S130-2B, the electronic device 1000 generates the 2Bnd clock signal CLK2_d2 that is obtained by delaying the 2And clock signal CLK2_d1 in units of an initially set resolution time according to clock skew control based on the value of the bits of the second part of the second digital signal DAC_err. For example, the electronic device 1000 may output the 2Bnd clock signal CLK2_d2 that is obtained by delaying the 2And clock signal CLK2_d1 in units of an initially set resolution time according to skew control based on the value of the bits of the second part of the second digital signal DAC_err. For example, the resolution time unit set to an initial value may be determined as a time unit in which a one-cycle time unit of the first clock signal is divided by $2^K$ (where K is the number of bits of the second part). As another example, the resolution time unit set to the initial value may be greater or less than the time unit in which the one-cycle time unit of the first clock signal is divided by $2^K$ (where K is the number of bits of the second part).

In operation S130-2C, the electronic device 1000 synthesizes a phase of the second clock signal CLK2 and a phase of the 2Bnd clock signal CLK2_d2 to generate the first control signal CTL1 having a pulse width corresponding to the error information included in the second digital signal DAC_err. For example, the error information may be expressed by the bits of the first and second parts of the second digital signal DAC_err. For example, the electronic device 1000 may generate the first control signal CTL1 having an interval width from a time (when the second clock signal CLK2 is generated) to a time when the 2Bnd clock signal CLK2_d2 is generated.

While inventive concepts have been particularly shown and described with reference to some example embodiments thereof, it will be understood that various changes in form and details may be made therein without departing from the spirit and scope of the following claims.

What is claimed is:

1. A digital-to-analog conversion apparatus comprising:
   an analog-to-digital conversion processing circuit configured to convert an analog voltage signal from an output terminal into a first digital signal, and to generate a second digital signal corresponding to a difference between the first digital signal and a target digital signal;
   a phase synthesis circuit configured to synthesize phases of signals, which are generated according to a delay and a skew delay, to generate a first control signal having a pulse width corresponding to error information included in the second digital signal, the delay being performed in units of a clock cycle based on the second digital signal, and the skew delay being performed within the clock cycle; and
   a charge pump circuit configured to select one of a charge loop and a discharge loop based on polarity information included in the second digital signal, and to generate the analog voltage signal according to a current flowing in the selected loop during an interval corresponding to the pulse width of the first control signal.

2. The digital-to-analog conversion apparatus of claim 1, wherein the phase synthesis circuit is further configured to control the pulse width of the first control signal according to clock skew control based on the error information included in the second digital signal.

3. The digital-to-analog conversion apparatus of claim 1, further comprising:
   an analog buffer circuit including a first input terminal to receive the analog voltage signal output from the charge pump circuit, and a second input connected to the output terminal.

4. The digital-to-analog conversion apparatus of claim 1, wherein the analog-to-digital conversion processing circuit comprises:
   an analog-to-digital converter configured to convert the analog voltage signal from the output terminal into the first digital signal, the first digital signal having N bits, where N is an integer greater than or equal to two; and
   a subtraction circuit configured to generate the second digital signal corresponding to the difference between the first digital signal and the target digital signal; wherein
   the second digital signal and the target digital signal have N bits.

5. The digital-to-analog conversion apparatus of claim 1, wherein the analog-to-digital conversion processing circuit comprises:
   an analog-to-digital converter configured to convert the analog voltage signal from the output terminal into the first digital signal, the first digital signal having M bits, where M is an integer greater than or equal to two; and
   a digital filter configured to receive the first digital signal, and to output the second digital signal based on an average filtering operation and a subtraction operation of the first digital signal and the target digital signal, the second digital signal having N bits, where N is an integer greater than M.

6. The digital-to-analog conversion apparatus of claim 5, wherein the digital filter comprises:
   a first multiplier configured to multiply the first digital signal by a first coefficient to generate a first arithmetic signal having N bits;
   an adder configured to add the first arithmetic signal and a third arithmetic signal to generate a second arithmetic signal having N bits;
   a delayer configured to delay the second arithmetic signal to generate a delayed second arithmetic signal;
   a second multiplier configured to multiply a second coefficient and the delayed second arithmetic signal to generate the third arithmetic signal having N bits;
   a subtractor configured to subtract the second arithmetic signal from the target digital signal to generate a fourth arithmetic signal having N bits;
   a third multiplier configured to multiply the fourth arithmetic signal by a third coefficient to generate a fifth arithmetic signal; and
   a barrel shifter configured to generate the second digital signal by shifting the fifth arithmetic signal by at least one bit; wherein
   each of the first to third coefficients is between zero and one.

7. The digital-to-analog conversion apparatus of claim 6, further comprising:
   a post-processor configured to,
     invert a value of bits of the second digital signal, except a polarity bit, when the polarity bit of the second digital signal has a first logic value, and
     output a value of the bits of the second digital signal as-is when the polarity bit of the second digital signal has a second logic value.

8. The digital-to-analog conversion apparatus of claim 1, wherein:
   the phase synthesis circuit is further configured to generate a second control signal corresponding to polarity information included in the second digital signal; and
   the charge pump circuit is configured to select the one of the charge loop and discharge loop based on the second control signal.

9. The digital-to-analog conversion apparatus of claim 1, wherein the phase synthesis circuit comprises:
   a first frequency divider configured to generate a first clock signal of which a pulse is generated at every two or more integer-multiple cycles of a second clock signal;
   a first delay circuit configured to generate a 2And clock signal by delaying the first clock signal in units of one-cycle time of the second clock signal, based on a value of bits of a first part of the second digital signal;
   a second delay circuit configured to generate a 2Bnd clock signal which is obtained by delaying the 2And clock signal in units of a set resolution time according to a clock skew control based on a value of bits of a second part of the second digital signal; and
   a logic circuit configured to generate the first control signal having the pulse width corresponding to a sum of delay values in the first and second delay circuits, based on the first clock signal and the 2Bnd clock signal.

10. The digital-to-analog conversion apparatus of claim 9, wherein:

the bits of the first part of the second digital signal include
a most significant bit (MSB) indicating polarity information and a number of upper bits indicating a delay value of the first delay circuit; and the bits of the second part of the second digital signal include a number of lower bits indicating a delay value of the second delay circuit.

11. The digital-to-analog conversion apparatus of claim 9, wherein the second delay circuit comprises:
a delay chain including a plurality of delay cells connected in series and corresponding to a number of the bits of the second part of the second digital signal; and
a decoder configured to control operations of the plurality of delay cells based on the value of the bits of the second part of the second digital signal; wherein
a delay time of each of the plurality of delay cells of the delay chain is set to increase by two times when a bit moves to an upper bit by one bit, with respect to a delay time of a delay cell corresponding to a least significant bit (LSB).

12. The digital-to-analog conversion apparatus of claim 9, wherein the phase synthesis circuit further comprises:
a calibration information calculating circuit configured to calculate a skew calibration value corresponding to a value that is delayed during one cycle of the second clock signal in a circuit equivalent to the second delay circuit, and to multiply the bits of the second part of the second digital signal by the calculated skew calibration value to generate a normalized value of the bits of the second part of the second digital signal.

13. The digital-to-analog conversion apparatus of claim 12, wherein the calibration information calculating circuit comprises:
a second frequency divider configured to divide a frequency of the second clock signal by two;
a delay chain including a plurality of delay cells connected in series and corresponding to a number of the bits of the second part of the second digital signal, the delay chain being configured to delay the two-frequency-divided second clock signal based on a decoding value;
a decoder configured to generate the decoding value for controlling the plurality of delay cells of the delay chain;
a RS flip-flop including a set terminal to receive the two-frequency-divided second clock signal, a reset terminal to receive a signal obtained through delay by the delay chain, and a Q terminal to output a signal generated based on the received signals;
a decoder control circuit configured to increase or decrease the decoding value based on a logic value of the signal output from the Q terminal of the RS flip-flop, to generate the skew calibration value; and
a multiplier configured to multiply the bits of the second part of the second digital signal by the skew calibration value to generate the normalized value of the bits of the second part of the second digital signal, and to supply the normalized value of the bits of the second part of the second digital signal to the second delay circuit.

14. A digital-to-analog conversion method comprising:
converting an analog voltage signal from an output terminal into a first digital signal;
generating a second digital signal corresponding to a difference between the first digital signal and a target digital signal;
synthesizing phases of signals generated according to delay control and skew delay to generate a charge pump control signal, the delay control being performed in units of a clock cycle and based on the second digital signal, and the skew delay being performed within the clock cycle; and
controlling a charge or discharge time of a charge pump circuit according to the charge pump control signal to generate the analog voltage signal.

15. The digital-to-analog conversion method of claim 14, wherein the synthesizing phases of signals comprises:
generating a control signal for selecting a charge loop or discharge loop of the charge pump circuit, based on polarity bit information included in the second digital signal; and
synthesizing the phases of the signals to generate the charge pump control signal, the charge pump control signal having a pulse width corresponding to error information included in the second digital signal.

16. A digital-to-analog conversion apparatus to convert a digital signal to an output analog voltage signal, the apparatus comprising:
an analog-to-digital conversion processing circuit configured to increase a resolution of the digital-to-analog conversion apparatus without increasing a frequency of an input clock signal; and
an analog voltage signal output circuit configured to generate the output analog voltage signal based on the input clock signal at the increased resolution of the digital-to-analog conversion apparatus.

17. The digital-to-analog conversion apparatus of claim 16, wherein:
the analog-to-digital conversion processing circuit is further configured to convert the output analog voltage signal to a first digital signal, and to generate an error digital signal based on the first digital signal and a target digital signal;
the error digital signal corresponds to a difference between the first digital signal and the target digital signal; and
the analog voltage signal output circuit is configured to generate the output analog voltage signal based on the input clock signal and the error digital signal.

18. The digital-to-analog conversion apparatus of claim 17, wherein:
the error digital signal includes a plurality of bits, a first bit among the plurality of bits being indicative of polarity information associated with the output analog voltage signal, and second bits among the plurality of bits being indicative of error information associated with the output analog voltage signal; and
the analog voltage signal output circuit adjusts the voltage of the output analog voltage signal based on the polarity information and the error information.

19. The digital-to-analog conversion apparatus of claim 18, wherein the analog voltage signal output circuit comprises:
a phase synthesis circuit configured to generate first and second control signals based on the error digital signal, the first control signal having a pulse width corresponding to the error information, and the second control signal being indicative of the polarity information; and
a charge pump circuit configured to adjust a voltage level of the output analog voltage signal by selecting one of a charge loop and a discharge loop of the charge pump circuit based on the second control signal, and generating the output analog voltage signal according to a current that flows in the selected loop during a period corresponding to a pulse width of the first control signal.

20. The digital-to-analog conversion apparatus of claim 17, wherein the analog voltage signal output circuit comprises:

a phase synthesis circuit configured to generate a plurality of control signals based on the error digital signal; and
a charge pump circuit configured to adjust the voltage level of the output analog voltage signal by selecting one of a charge loop and a discharge loop based on the plurality of control signals.

\* \* \* \* \*